(12) United States Patent
Kim

(10) Patent No.: US 10,366,761 B2
(45) Date of Patent: Jul. 30, 2019

(54) MEMORY SYSTEM AND OPERATING METHOD THEREOF

(71) Applicant: SK hynix Inc., Gyeonggi-do (KR)

(72) Inventor: Soo-Nyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/602,293

(22) Filed: May 23, 2017

(65) Prior Publication Data
US 2018/0068731 A1 Mar. 8, 2018

(30) Foreign Application Priority Data

Sep. 5, 2016 (KR) .................. 10-2016-0113738

(51) Int. Cl.
| | | |
|---|---|---|
| G11C 16/16 | (2006.01) | |
| G06F 3/06 | (2006.01) | |
| G11C 16/26 | (2006.01) | |
| G11C 16/34 | (2006.01) | |
| G11C 29/00 | (2006.01) | |

(52) U.S. Cl.
CPC ............ *G11C 16/16* (2013.01); *G06F 3/0604* (2013.01); *G06F 3/064* (2013.01); *G06F 3/0679* (2013.01); *G11C 16/26* (2013.01); *G11C 16/3459* (2013.01); *G11C 29/785* (2013.01)

(58) Field of Classification Search
CPC ...... G11C 29/00; G11C 2299/00; G11C 16/16
USPC .................................. 365/185.11, 185.17
See application file for complete search history.

(56) References Cited

U.S. PATENT DOCUMENTS

| | | | | |
|---|---|---|---|---|
| 2008/0098192 A1* | 4/2008 | Im ...................... | G06F 12/0246 | 711/170 |
| 2009/0059695 A1* | 3/2009 | Kim .................... | G11C 29/808 | 365/200 |
| 2010/0228940 A1* | 9/2010 | Asnaashari ......... | G06F 12/0246 | 711/170 |
| 2011/0119442 A1* | 5/2011 | Haines ................ | G06F 12/0246 | 711/113 |

FOREIGN PATENT DOCUMENTS

| | | |
|---|---|---|
| KR | 1020110127729 | 11/2011 |
| KR | 1020150107197 | 9/2015 |

* cited by examiner

*Primary Examiner* — Han Yang
(74) *Attorney, Agent, or Firm* — IP & T Group LLP

(57) ABSTRACT

A memory system may include: a memory device including a plurality of memory blocks; and a controller suitable for managing the memory blocks as a plurality of super memory blocks by grouping them in a type corresponding to a predetermined condition, managing a bad block pool of the form of bitmaps and indexes by setting super memory blocks among the super memory blocks, in each of which one or more bad memory blocks are included, as bad super memory blocks, and managing regenerated super memory blocks by checking, through the bad block pool, normal memory blocks included in the respective bad super memory blocks and then performing grouping in the type corresponding to the predetermined condition.

20 Claims, 13 Drawing Sheets

MEMORY SYSTEM AND OPERATING METHOD THEREOF

CROSS-REFERENCE TO RELATED APPLICATION

This application claims priority under 35 U.S.C. § 119 to Korean Patent Application No. 10-2016-0113738 filed on Sep. 5, 2016 in the Korean Intellectual Property Office, the disclosure of which is incorporated herein by reference in its entirety.

TECHNICAL FIELD

Exemplary embodiments relate to a memory system and, more particularly, to a memory system for processing data to and from a memory device, and an operating method thereof.

DISCUSSION OF THE RELATED ART

The computer environment paradigm has changed to ubiquitous computing systems that can be used anytime and anywhere. Due to this, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption because they have no moving parts. Examples of memory systems having such advantages include universal serial bus (USB) memory devices, memory cards having various interfaces, and solid state drives (SSD).

SUMMARY

Various embodiments are directed to a memory system and an operating method thereof, capable of managing the plurality of memory blocks included in a memory device in units of super memory blocks.

In an embodiment, a memory system may include: a memory device including a plurality of memory blocks; and a controller suitable for managing the memory blocks as a plurality of super memory blocks by grouping them according to a predetermined condition, managing a bad block pool including bitmaps and indexes by setting super memory blocks having one or more bad memory blocks as bad super memory blocks, and managing reused super memory blocks by checking, through the bad block pool, normal memory blocks included in the respective bad super memory blocks and then performing grouping according to the predetermined condition.

The controller may include set values including of indexes corresponding to super block address informations indicating the respective bad super memory blocks, in the bad block pool, and the controller may change positions of normal memory blocks and bad memory bocks included in the respective bad super memory blocks, into bad memory block management information including bit maps, and includes the bad memory block management information in the bad block pool in correspondence to the respective set values.

After checking the positions of the normal memory blocks included in the respective bad super memory blocks, through the bad memory block management information included in the bad block pool, the controller may generate a plurality of set value tables by grouping the set values corresponding to the respective checked bad memory block management information according to the predetermined condition, and may manage the respective set value tables as the reused super memory blocks.

The controller may erase the bad memory block management information included in the bad block pool, after generating the set value tables.

The controller may retain the bad memory block management information included in the bad block pool, even after generating the set value tables, and in the case where a super memory block which should be included additionally in the bad super memory blocks exists among the super memory blocks, the controller may check again normal memory blocks included in the respective bad super memory blocks, through the bad memory block management information of the bad block pool, may generate again the set value tables by grouping again the set values corresponding to the bad memory block management information checked again, according to the predetermined condition, and may manage the set value tables generated again, as the reused super memory blocks.

The memory device may further include: a plurality of planes respectively corresponding to a plurality of ways capable of inputting/outputting data in an interleaving scheme through sharing one channel, and respectively including the memory blocks; and a plurality of memory dies respectively corresponding to a plurality of channels capable of inputting/outputting data in an interleaving scheme, and respectively including the planes.

The controller may include, in the predetermined condition, grouping one optional memory block included in a first plane of any one memory die among the memory dies and one optional memory block included in a second plane.

The controller may include, in the predetermined condition, grouping one optional memory block included in a first plane of a first memory die among the memory dies and one optional memory block included in a first plane of a second memory die, and grouping one optional memory block included in a second plane of the first memory die and one optional memory block included in a second plane of the second memory die.

The controller may include, in the predetermined condition, grouping one optional memory block included in a first plane of a first memory die among the memory dies, one optional memory block included in a second plane of the first memory die, one optional memory block included in a first plane of a second memory die and one optional memory block included in a second plane of the second memory die.

In an embodiment, a method for operating a memory system including a memory device which includes a plurality of memory blocks, may include: managing the memory blocks as a plurality of super memory blocks by grouping them according to a predetermined condition; managing a bad block pool including bitmaps and indexes by setting super memory blocks having one or more bad memory blocks, as bad super memory blocks; and managing reused super memory blocks by checking, through the bad block pool, normal memory blocks included in the respective bad super memory blocks and then performing grouping according to the predetermined condition.

The managing of the bad block pool may include: including set values including of indexes corresponding to super block address informations indicating the respective bad super memory blocks, in the bad block pool; and changing positions of normal memory blocks and bad memory bocks included in the respective bad super memory blocks, into bad memory block management information including of bit maps, and including the bad memory block management information in the bad block pool in correspondence to the respective set values.

The managing of the reused super memory blocks may include: checking the positions of the normal memory blocks included in the respective bad super memory blocks, through the bad memory block management information included in the bad block pool; and generating a plurality of set value tables by grouping the set values corresponding to the respective bad memory block management information checked in the checking, according to the predetermined condition, and managing the respective set value tables as the reused super memory blocks.

The method may further include: erasing the bad memory block management information included in the bad block pool, after generating the set value tables in the managing of the reused super memory blocks.

The method may further include: retaining the bad memory block management information included in the bad block pool, after generating the set value tables in the managing of the reused super memory blocks, and the managing of the reused super memory blocks may include: checking again, in the case where, after the retaining, a super memory block which should be included additionally in the bad super memory blocks exists among the super memory blocks, normal memory blocks included in the respective bad super memory blocks, through the bad memory block management information of the bad block pool; and generating again the set value tables by grouping again the set values corresponding to the bad memory block management information checked again in the checking again, according to the predetermined condition, and managing the set value tables generated again, as the reused super memory blocks.

A plurality of planes respectively corresponding to a plurality of ways capable of inputting/outputting data in an interleaving scheme through sharing one channel and respectively including the memory blocks, and a plurality of memory dies respectively corresponding to a plurality of channels capable of inputting/outputting data in an interleaving scheme and respectively including the planes may be additionally included in the memory device.

The predetermined condition may include grouping one optional memory block included in a first plane of any one memory die among the memory dies and one optional memory block included in a second plane.

The predetermined condition may include grouping one optional memory block included in a first plane of a first memory die among the memory dies and one optional memory block included in a first plane of a second memory die, and grouping one optional memory block included in a second plane of the first memory die and one optional memory block included in a second plane of the second memory die.

The predetermined condition may include grouping one optional memory block included in a first plane of a first memory die among the memory dies, one optional memory block included in a second plane of the first memory die, one optional memory block included in a first plane of a second memory die and one optional memory block included in a second plane of the second memory die.

In an embodiment, a memory system may include: a memory device including a plurality of super memory blocks; and a controller suitable for generating a bad block pool and a reused super block table, and generating one or more reused super memory blocks based on the bad block pool and the reused super block table. The bad block pool may include one or more bad super memory block indexes, one or more super memory block addresses and one or more bad memory block information respectively corresponding to one or more bad super memory blocks among the super memory blocks, each bad memory block information may include a bitmap, each bit of which represents one of a normal memory block and a bad memory block included in a corresponding bad super memory block, the reused super block table may include information of the reused super memory blocks, each information of the reused super memory blocks may include a bitmap, each bit of which has one of values of the bad super memory block indexes and represents a normal memory block of one of the bad super memory blocks represented by the value of the bad super memory block index, the controller may generate the reused super memory blocks by replacing a bad memory block of a target super memory block with a normal memory block of a victim super memory block, and the target memory block and the victim memory block may be included in the bad super memory blocks.

The controller may erase the bad memory block information included in the bad block pool, after generating the reused super memory blocks.

BRIEF DESCRIPTION OF THE DRAWINGS

These and other features and advantages of the present invention will become apparent to those skilled in the art to which the present invention pertains from the following detailed description in reference to the accompanying drawings, wherein.

DETAILED DESCRIPTION

Figure 1:
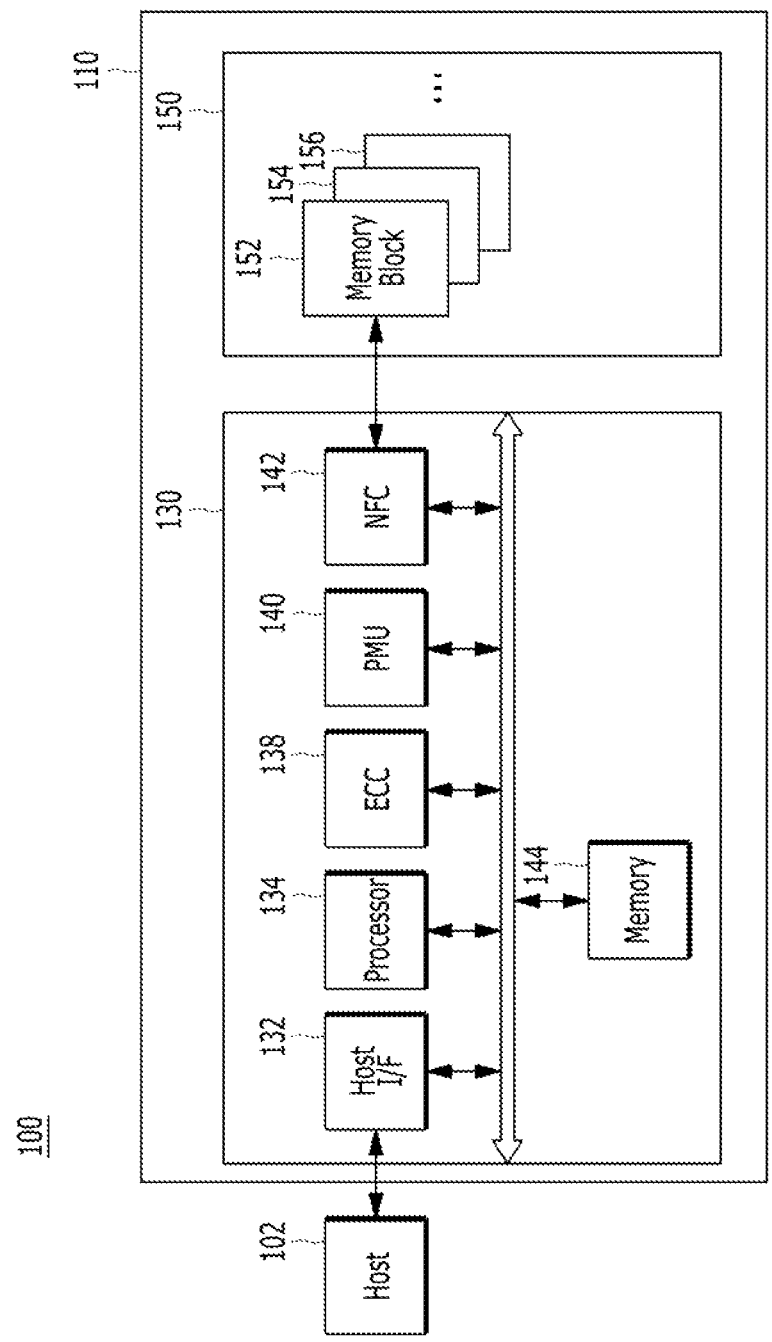
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate various features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 and the memory system 110.

The host 102 may include portable electronic devices such as a mobile phone, MP3 player and laptop computer or non-portable electronic devices such as a desktop computer, game machine, TV and projector.

The host 102 may include at least one OS (operating system). The OS may manage and control overall functions and operations of the host 102, and provide an operation between the host 102 and a user using the data processing system 100 or between the host and the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include one or more OSs. The host 102 may execute an OS to perform an operation corresponding to a user's request on the memory system 110.

The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, a compact flash (CF) card, a smart media card (SMC), a personal computer memory card international association (PCMCIA) card and a memory stick. The MMC may include an embedded MMC (eMMC), a reduced size MMC (RS-MMC) and a micro-MMC. The SD card may include a mini-SD card and a micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM) and a flash memory. The storage device may have a two-dimensional or a three-dimensional stack structure. Preferably, the storage device may have a three-dimensional stack structure. In an embodiment, the storage device may be a flash memory having a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as a single semiconductor device to constitute an SSD. When the memory system 110 is used as an SSD, the operating speed of the host 102 connected to the memory system 110 can be improved. The controller 130 and the memory device 150 may be integrated as a single semiconductor device to constitute a memory card. For example, the controller 130 and the memory device 150 may constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
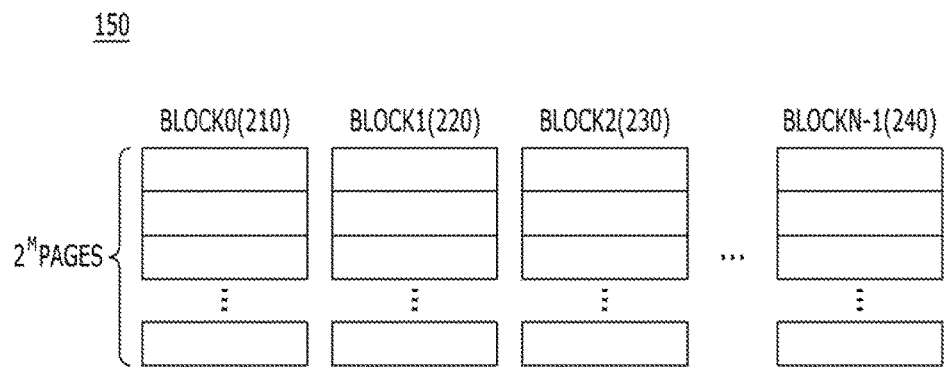
FIG. 2 is a schematic diagram illustrating an exemplary configuration of a memory device employed in the memory system of FIG. 1.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, or a multi-level cell (MLC) storing 2- or more bit data. Examples of MLC's include a two level cell storing 2-bit data, a triple level cell (TLC) storing 3-bit data, a quadruple level cell (QLC) storing 4-bit level cell, a multiple level cell storing 5-or-more-bit data, and so forth.

Figure 3:
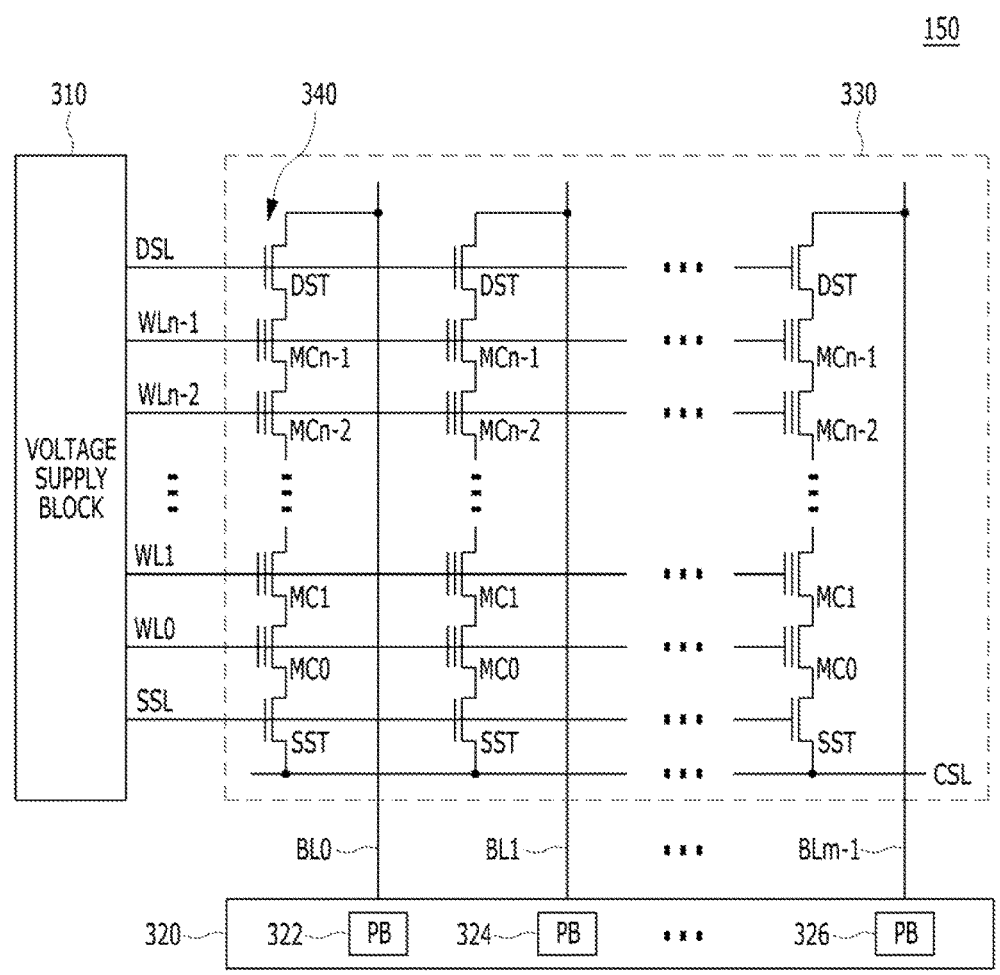
FIG. 3 is a circuit diagram illustrating an exemplary configuration of a memory cell array of a memory block in the memory device of FIG. 2.

FIG. 3 is a circuit diagram Illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
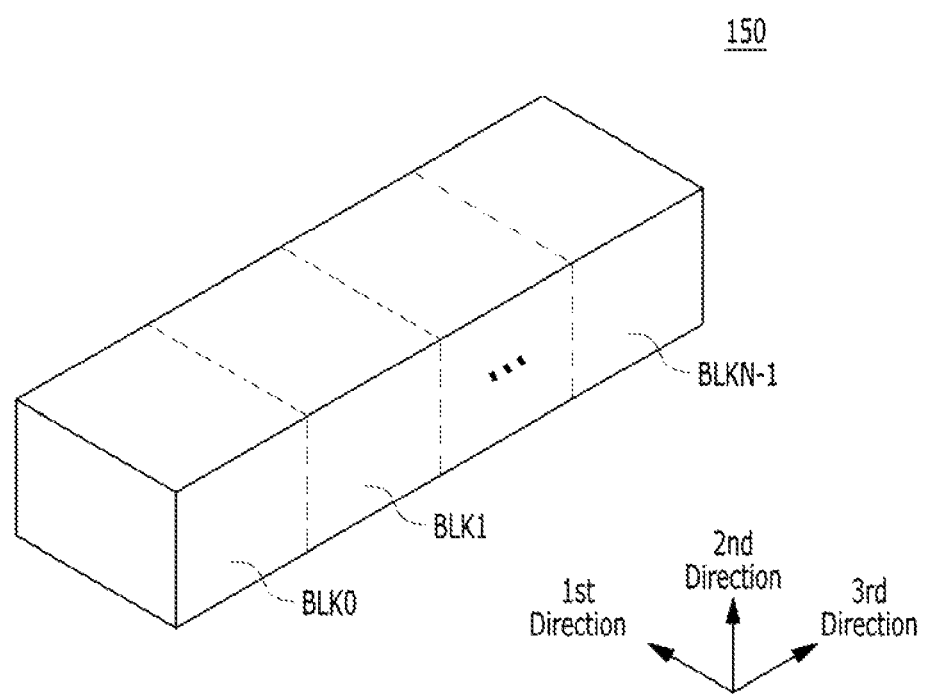
FIG. 4 is a schematic diagram illustrating an exemplary three-dimensional structure of the memory device of FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Figure 5:
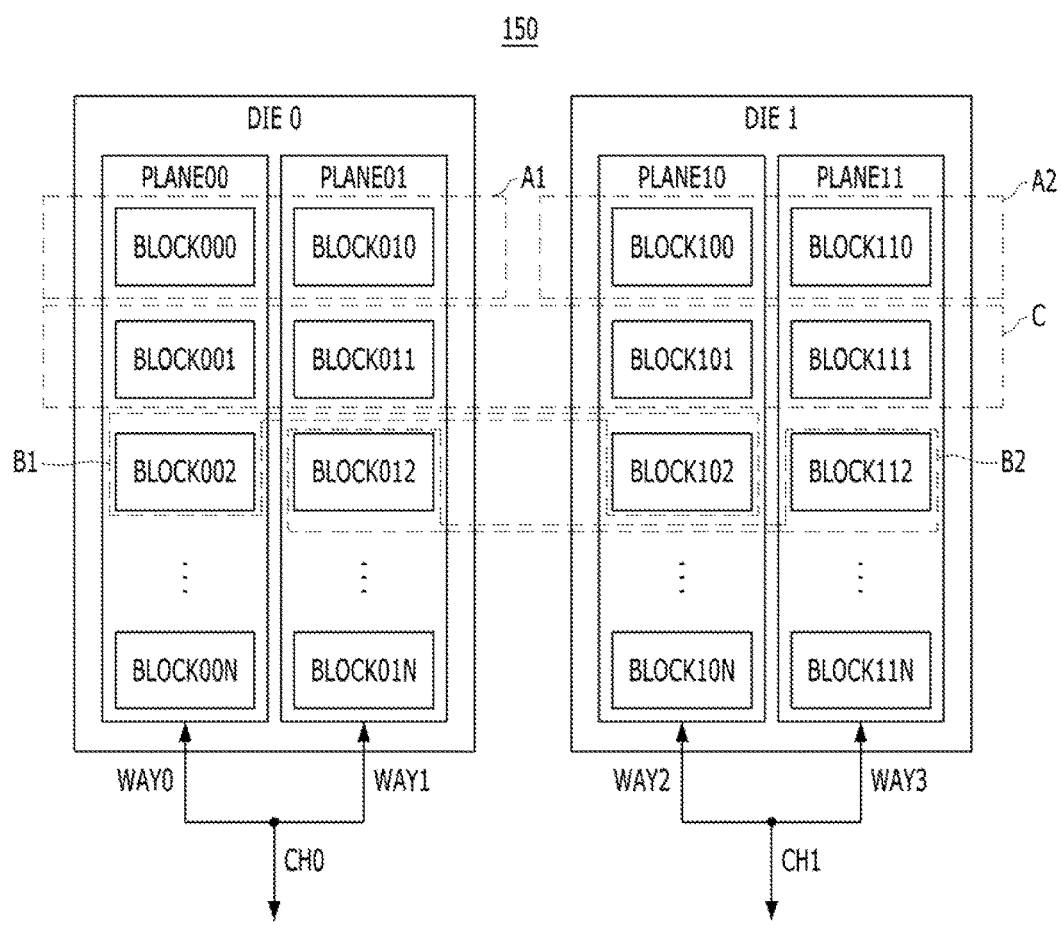
FIG. 5 is a diagram illustrating a super memory block used in a memory system in accordance with an embodiment of the present invention.

FIG. 5 is a diagram illustrating a super memory block used in a memory system in accordance with an embodiment of the present invention.

Referring to FIG. 5, the memory device 150 includes a plurality of memory blocks BLOCK000 to BLOCK11N.

The memory device 150 includes a zeroth memory die DIE0 capable of inputting/outputting data through a zeroth channel CH0 and a first memory die DIE1 capable of inputting/outputting data through a first channel CH1. The zeroth channel CH0 and the first channel CH1 may input/output data in an interleaving scheme.

The zeroth memory die DIE0 includes a plurality of planes PLANE00 and PLANE01 respectively corresponding to a plurality of ways WAY0 and WAY1 capable of inputting/outputting data in the interleaving scheme by sharing the zeroth channel CH0.

The first memory die DIE1 includes a plurality of planes PLANE10 and PLANE11 respectively corresponding to a plurality of ways WAY2 and WAY3 capable of inputting/outputting data in the interleaving scheme by sharing the first channel CH1.

The first plane PLANE00 of the zeroth memory die DIE0 includes a predetermined number of memory blocks BLOCK000 to BLOCK00N among the plurality of memory blocks BLOCK000 to BLOCK11N.

The second plane PLANE01 of the zeroth memory die DIE0 includes the predetermined number of memory blocks BLOCK010 to BLOCK01N among the plurality of memory blocks BLOCK000 to BLOCK11N.

The first plane PLANE10 of the first memory die DIE1 includes the predetermined number of memory blocks BLOCK100 to BLOCK10N among the plurality of memory blocks BLOCK000 to BLOCK11N.

The second plane PLANE11 of the first memory die DIE1 includes the predetermined number of memory blocks BLOCK110 to BLOCK11N among the plurality of memory blocks BLOCK000 to BLOCK11N.

In this manner, the plurality of memory blocks BLOCK000 to BLOCK11N included in the memory device 150 may be divided into groups according to their physical positions and their use of the ways and channels.

FIG. 5 illustrates, as an example, two memory dies DIE0 and DIE1 included in the memory device 150, two planes included in each of the dies DIE0 and DIE1 and the same predetermined number of memory blocks included in each of planes. It is noted, that according to a designer's choice, the number of memory dies may be greater or smaller than two may be included in the memory device 150, and a number of planes that is larger or smaller than two may be included in each memory die. Also, the number of memory blocks included in each plane may be adjusted variously according to a designer's choice.

The controller 130 may manage a plurality of memory blocks by grouping the memory blocks into several super memory blocks. Each super memory block includes a plurality of memory blocks which may be selected simultaneously among the plurality of memory blocks.

Various schemes of grouping the plurality of memory blocks into a plurality of super memory blocks by the controller 130 may be exemplified herein with reference to FIG. 5.

A first scheme is to manage one super memory block A1 by grouping, by the controller 130, one optional memory block BLOCK000 in the first plane PLANE00 and one optional memory block BLOCK010 in the second plane PLANE01 of the zeroth memory die DIE0 between the plurality of memory dies DIE0 and DIE1 included in the memory device 150. When applying the first scheme to the first memory die DIE1 between the plurality of memory dies DIE0 and DIE1 included in the memory device 150, the controller 130 may manage one super memory block A2 by grouping one optional memory block BLOCK100 in the first plane PLANE10 and one optional memory block BLOCK110 in the second plane PLANE11 of the first memory die DIE1.

A second scheme is to manage one super memory block B1 by grouping, by the controller 130, one optional memory block BLOCK002 included in the first plane PLANE00 of the zeroth memory die DIE0 between the plurality of memory dies DIE0 and DIE1 included in the memory device 150 and one optional memory block BLOCK102 included in the first plane PLANE10 of the first memory die DIE1. When applying the second scheme again, the controller 130 may manage one super memory block B2 by grouping one optional memory block BLOCK012 included in the second plane PLANE01 of the zeroth memory die DIE0 between the plurality of memory dies DIE0 and DIE1 included in the memory device 150 and one optional memory block BLOCK112 included in the second plane PLANE11 of the first memory die DIE1.

A third scheme is to manage one super memory block C by grouping, by the controller 130, one optional memory block BLOCK001 included in the first plane PLANE00 of the zeroth memory die DIE0 between the plurality of memory dies DIE0 and DIE1 included in the memory device 150, one optional memory block BLOCK011 included in the second plane PLANE01 of the zeroth memory die DIE0, one optional memory block BLOCK101 included in the first plane PLANE10 of the first memory die DIE1 and one optional memory block BLOCK111 included in the second plane PLANE11 of the first memory die DIE1.

In the respective super memory blocks, memory blocks may be simultaneously selected through an interleaving scheme, for example, a channel interleaving scheme, a memory die interleaving scheme, a memory chip interleaving scheme or a way interleaving scheme.

Figure 6:
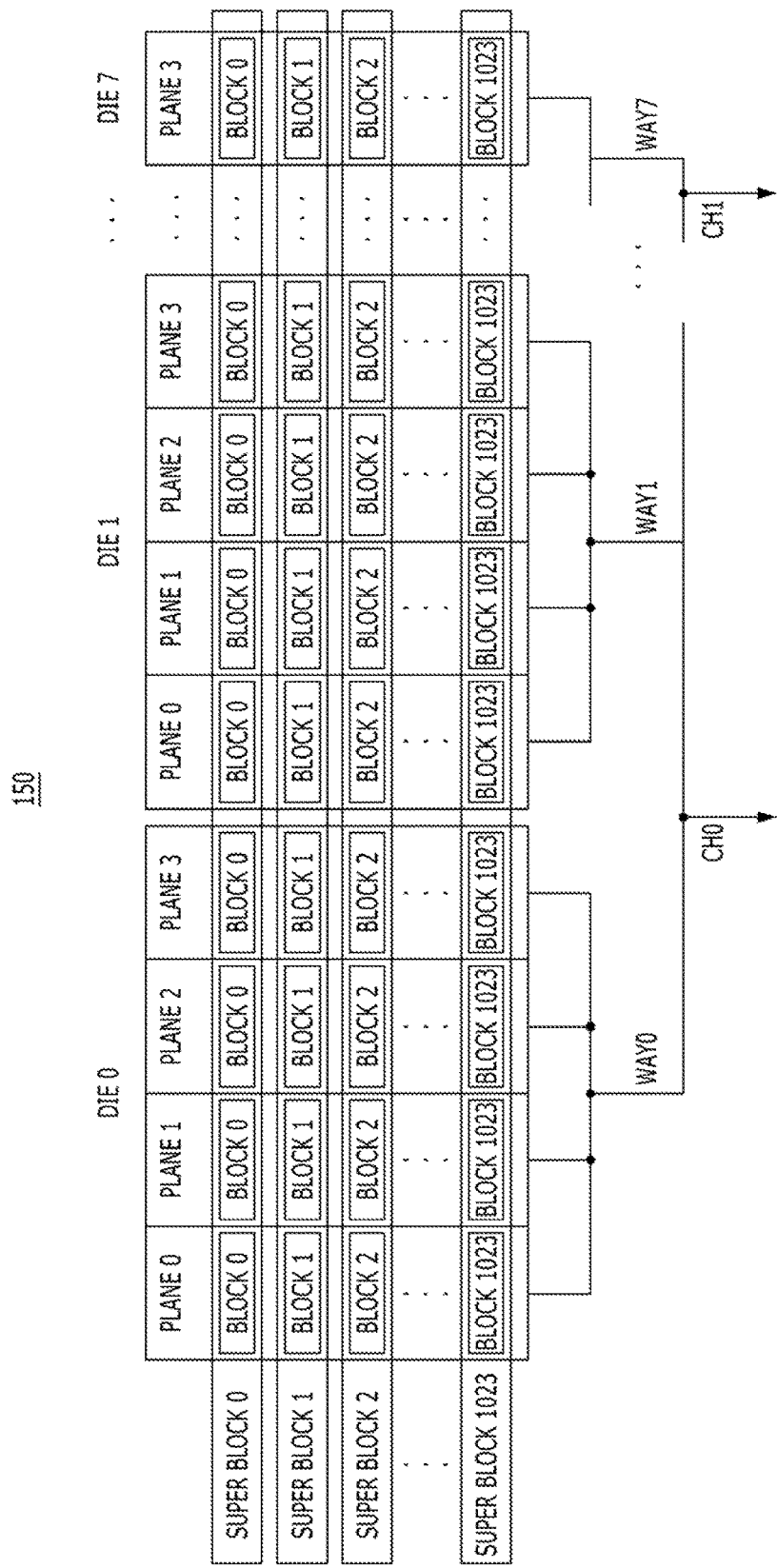
FIG. 6 is a diagram illustrating an operation of managing memory blocks in units of super memory blocks in the memory system in accordance with the embodiment of the present invention.

FIG. 6 is a diagram illustrating an operation of managing memory blocks in units of super memory blocks in a memory system in accordance with an embodiment of the present invention.

Referring to FIG. 6, a scheme of selecting each of super memory blocks may be seen.

First, it is exemplified that the memory device 150 includes eight memory dies DIE<0:7>, each of the eight memory dies DIE<0:7> includes four planes PLANE<0:3> to allow the eight memory dies DIE<0:7> to include total 32 planes PLANE<0:3>*8, and each of the 32 planes PLANE<0:3>*8 includes 1,024 memory blocks BLOCK<0:1023>. In other words, it is exemplified that the memory device 150 includes total 32,768 memory blocks BLOCK<0:1023>*32.

Also, it is exemplified that, in the memory device 150, the total 32 planes PLANE<0:3>*8 included in the eight memory dies DIE<0:7> input/output data through two channels CH<0:1> and eight ways WAY<0:7>. Namely, it is exemplified that, in the memory device 150, the four planes PLANE<0:3> of each of the respective 8 dies DIE<0:7> share one of 8 ways WAY<0:7>. Also, a first half of the 8 ways WAY<0:7> (e.g., first four ways WAY<0:3>) share a first channel CH0 and a second half of the 8 ways WAY<0:7> (e.g., last four ways WAY<4:7>) share a second channel CH1.

The controller 130 of the memory system 110 in accordance with an embodiment of the present invention uses a scheme of managing the plurality of memory blocks included in the memory device 150, by dividing them in units of super memory blocks.

As exemplified in FIG. 6, the controller 130 manages each of the super memory blocks SUPER BLOCK<0:1023> by selecting one arbitrary memory block in each of 32 planes PLANE<0:3>*8 included in the memory device 150. Therefore, 32 memory blocks are included in each of the super memory blocks SUPER BLOCK<0:1023>.

Since the controller 130 selects simultaneously the 32 memory blocks included in each of the super memory blocks SUPER BLOCK<0:1023>, in a configuration in which management is performed in units of super memory blocks as in FIG. 6, only super memory block addresses are used for selecting the respective super memory blocks SUPER BLOCK<0:1023>.

In other words, in a configuration in which management is performed in units of super memory blocks, instead of using memory block addresses (not shown) for selecting the respective 32,768 memory blocks BLOCK<0:1023>*32 included in the memory device 150, only super memory block addresses (not shown) are used for selecting the respective 1,024 super memory blocks SUPER BLOCK<0:1023>.

In this manner, in order to use only the super memory block addresses, the controller 130 uses a scheme of managing super memory blocks by grouping memory blocks of the same locations in the respective 32 planes PLANE<0:3>*8 included in the memory device 150.

For example, the controller 130 manages a zeroth super memory block SUPER BLOCK0 by grouping 32 zeroth memory blocks BLOCK0 in the respective 32 planes PLANE<0:3>*8 included in the memory device 150, manages a first super memory block SUPER BLOCK1 by grouping 32 first memory blocks BLOCK1 in the respective 32 planes PLANE<0:3>*8, and manages a second super memory block SUPER BLOCK2 by grouping 32 second memory blocks BLOCK2 in the respective 32 planes PLANE<0:3>*8. In this manner, the controller 130 manages the 32,768 memory blocks BLOCK<0:1023>*32 included in the memory device 150, by dividing them into the total 1,024 super memory blocks SUPER BLOCK<0:1023>.

Meanwhile, it is substantially impossible for all the memory blocks included in the memory device 150, to operate normally. Namely, it is the norm that bad memory blocks which do not operate normally exist to some extent among the plurality of memory blocks included in the memory device 150. For example, in the embodiment of FIG. 6, where it is illustrated that 32,768 memory blocks BLOCK<0:1023>*32 are included in the memory device 150, about 650 memory blocks corresponding to approximately 2% may be bad memory blocks.

In this regard, as described above, in the case where the controller 130 uses the scheme of managing super memory blocks by grouping memory blocks of the same locations in the respective 32 planes PLANE<0:3>*8 included in the memory device 150 in order to use only super memory block addresses, a bad super memory block, in which a bad memory block is included among the super memory blocks SUPER BLOCK<0:1023>, may not operate normally. That is to say, if even one memory block among the 32 memory blocks included in each of the super memory blocks SUPER BLOCK<0:1023> is determined as a bad memory block, a corresponding bad super memory block may not operate normally.

In this manner, even though only one memory block is a bad memory block and all the remaining 31 memory blocks are normal among the 32 memory blocks included in any one super memory block, the corresponding bad super memory block is not used, which is markedly inefficient.

In consideration of this fact, in the memory system 110 in accordance with an embodiment of the present invention, a bad super memory block where at least one bad memory block is included is reused by employing a reused super block table.

Figure 7:
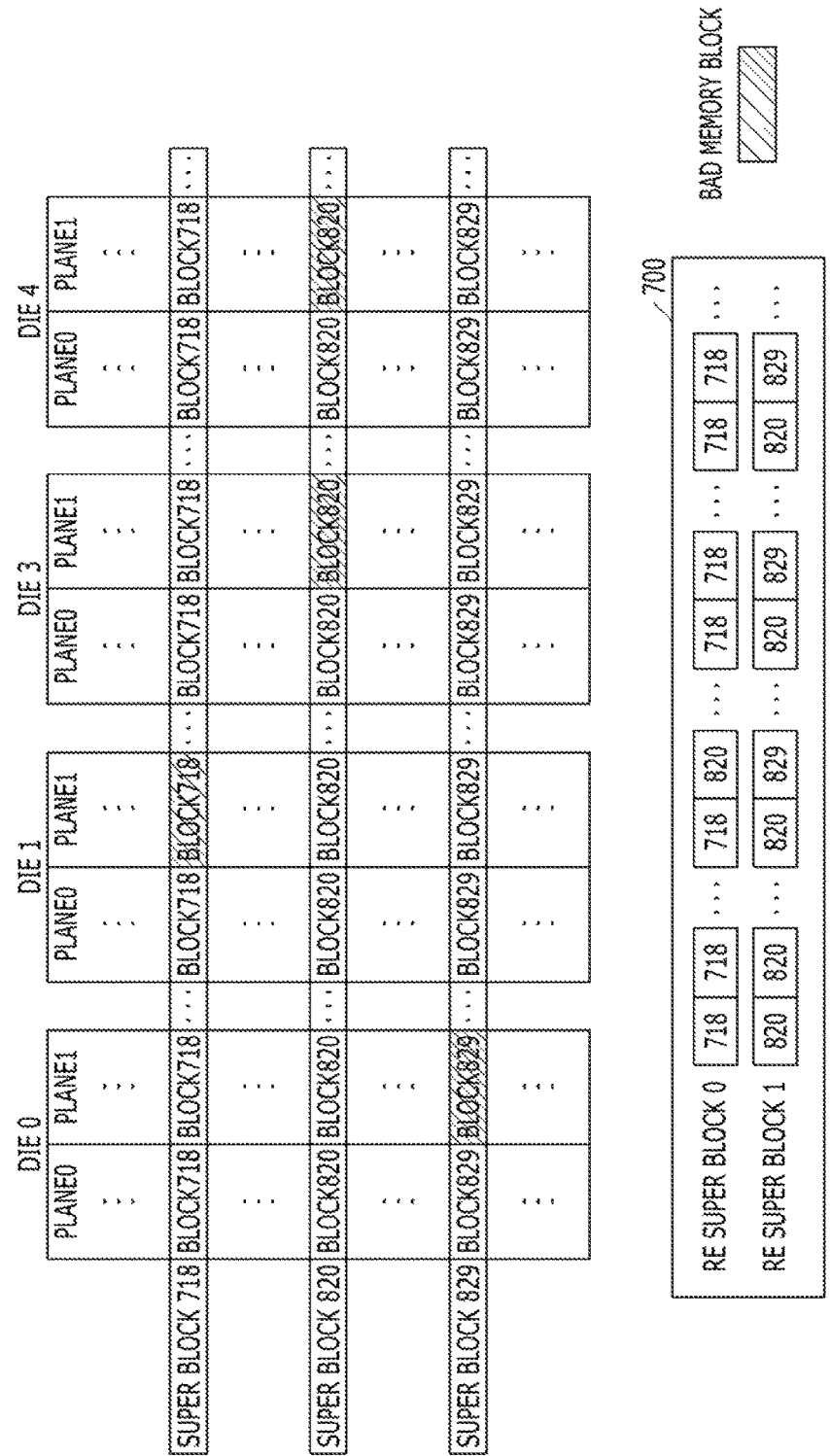
FIG. 7 is a diagram illustrating a method for reusing a bad super memory block, in which one or more bad memory blocks are included, in a memory system in accordance with the embodiment of the present invention.

FIG. 7 is a diagram illustrating a method for reusing a bad super memory block, in which one or more bad memory blocks are included in a memory system, in accordance with an embodiment of the present invention.

Referring to FIG. 7, it may be seen that one or more memory blocks among the 32 memory blocks included in each of the 718^th super memory block SUPER BLOCK718, the 820^th super memory block SUPER BLOCK820 and the 829^th super memory block SUPER BLOCK829 among the plurality of super memory blocks SUPER BLOCK<0:1023> included in the memory device 150 shown in FIG. 6 are determined as bad memory blocks.

In detail, it may be seen that, among the 32 memory blocks included in the 718^th super memory block SUPER BLOCK718, the memory block included in the first plane PLANE1 of the first memory die DIE1 is determined as a bad memory block and the remaining 31 memory blocks are normal memory blocks.

Also, it may be seen that, among the 32 memory blocks included in the 820^th super memory block SUPER BLOCK820, the memory block included in the first plane PLANE1 of the third memory die DIE3 and the memory block included in the first plane PLANE1 of the fourth memory die DIE4 are determined as bad memory blocks and the remaining 30 memory blocks are normal memory blocks.

Moreover, it may be seen that, among the 32 memory blocks included in the 829^th super memory block SUPER BLOCK829, the memory block included in the first plane PLANE1 of the zeroth memory die DIE0 is determined as a bad memory block and the remaining 31 memory blocks are normal memory blocks.

In this state, the controller 130 generates a reused super block table 700 for replacing the bad memory blocks included in the respective bad super memory blocks (i.e., 718^th super memory block SUPER BLOCK718, 820^th super memory block SUPER BLOCK820 and 829^th super memory block SUPER BLOCK829) with normal memory blocks among the super memory blocks SUPER BLOCK<0:1023>, thereby recovering the bad super memory blocks into normal super memory blocks.

In detail, in order to reuse the bad 718^th super memory block SUPER BLOCK718, the controller 130 may replace the bad memory block included in the first plane PLANE1 of the first memory die DIE1 among the 32 memory blocks included in the 718^th super memory block SUPER BLOCK718 (hereinafter, also referred to as a "target super memory block").

To this end, the controller 130 selects a victim super memory block in which at least one bad memory block is included, among the super memory blocks SUPER BLOCK<0:1023>. The controller 130 excludes from a search for a target or a victim super memory block the super memory blocks SUPER BLOCK<0:1023> in which only normal memory blocks are included.

For example, the controller 130 may select as the victim super memory block the bad 820^th super memory block SUPER BLOCK820 which includes two bad memory blocks. In this state, the controller 130 checks whether the locations of the bad memory blocks included in the bad 820^th super memory block SUPER BLOCK820 (i.e., the victim super memory block) are the same as the location of the bad memory block included in the bad 718^th super memory block SUPER BLOCK718 (i.e. the target super memory block).

If the locations of the bad memory blocks included in the bad 820^th super memory block SUPER BLOCK820 (i.e., the victim super memory block) are the same as the location of the bad memory block included in the bad 718^th super memory block SUPER BLOCK718 (i.e. the target super memory block), the controller 130 may select another bad super memory block as the victim super memory block. For example, the 820^th super memory block SUPER BLOCK820 is excluded from being a target in a victim search, and another search for a victim super memory block is performed. Conversely, if the position of the bad memory block in the target super memory block SUPER BLOCK 718 is different from the positions of the bad memory blocks in the super memory block SUPER BLOCK 820, then the 820^th super memory block SUPER BLOCK820 is determined as a victim super memory block.

As can be seen from the drawing, the bad memory block of the bad 718^th super memory block SUPER BLOCK718 (i.e. the target super memory block) is located in the first plane PLANE1 of the first memory die DIE1, and the bad memory blocks of the bad 820^th super memory block SUPER BLOCK820 (i.e., the victim super memory block) are located in the first plane PLANE1 of the third memory die DIE3 and the first plane PLANE1 of the fourth memory die DIE4. In other words, the locations of the bad memory blocks included in the 820^th super memory block SUPER BLOCK820 are locations that do not overlap with the location of the bad memory block included in the 718^th super memory block SUPER BLOCK718.

Therefore, the controller 130 determines the 820^th super memory block SUPER BLOCK820 as the victim super memory block, and generates the reused super block table 700 such that the memory block included in the first plane PLANE1 of the first memory die DIE1 among the 32 memory blocks included in the 820^th super memory block SUPER BLOCK820 (i.e., the victim super memory block)

may be used in the 718^th super memory block SUPER BLOCK718 (i.e. the target super memory block).

Namely, in order to replace the 718^th super memory block SUPER BLOCK718, the controller 130 sets the first row of the reused super block table 700 as a zeroth reused super memory block RE SUPER BLOCK0, and stores the block address values of 32 memory blocks for replacing the target super memory block or the 718^th super memory block SUPER BLOCK718.

Thus, in the values of the zeroth reused super memory block RE SUPER BLOCK0 stored in the first row of the reused super block table 700, only a block address for indicating the memory block included in the first plane PLANE1 of the first memory die DIE1 among 32 memory blocks is the block address of the 820^th super memory block SUPER BLOCK820, and all the remaining 31 block addresses are the block addresses of the 718^th super memory block SUPER BLOCK718.

In this way, because the reused super block table 700 is generated, when the controller 130 accesses the 718^th super memory block SUPER BLOCK718, reference may be made to the values of the zeroth reused super memory block RE SUPER BLOCK0 stored in the first row of the reused super block table 700.

Then, in order to reuse the bad 820^th super memory block SUPER BLOCK820 (i.e. the target super memory block), the controller 130 may replace the memory block included in the first plane PLANE1 of the first memory die DIE1 and the bad memory blocks included in the first plane PLANE1 of the third memory die DIE3 and the first plane PLANE1 of the fourth memory die DIE4 among the 32 memory blocks included in the bad 820^th super memory block SUPER BLOCK820.

As described above, the memory block of the bad 820^th super memory block SUPER BLOCK820 included in the first plane PLANE1 of the first memory die DIE1 is taken for the reused super memory block RE SUPER BLOCK0, and thus the bad 820^th super memory block SUPER BLOCK820 requires a normal memory block for the taken memory block as well as the bad memory blocks included therein.

Hence, in order to reuse the bad 820^th super memory block SUPER BLOCK820, the controller 130 selects a victim super memory block in which at least one bad memory block is included, among the super memory blocks SUPER BLOCK<0:1023>.

For example, the controller 130 may select as the victim super memory block the bad 829^th super memory block SUPER BLOCK829 which includes one bad memory block. In this state, the controller 130 checks whether the location of the bad memory block included in the 829^th super memory block SUPER BLOCK829 (i.e., the victim super memory block) is the same as the location of the bad memory block included in the 718^th super memory block SUPER BLOCK718 (i.e. the previous target super memory block) and the locations of the bad memory blocks included in the 820^th super memory block SUPER BLOCK820 (i.e. the current target super memory block).

If the location of the bad memory block included in the 829^th super memory block SUPER BLOCK829 (i.e., the victim super memory block) is the same as the location of the bad memory block included in the 718^th super memory block SUPER BLOCK718 (i.e. the previous target super memory block) and the locations of the bad memory blocks included in the 820^th super memory block SUPER BLOCK820 (i.e. the current target super memory block), the controller 130 may select another bad super memory block as the victim super memory block.

As can be seen from the drawing, the bad memory block of the bad 829^th super memory block SUPER BLOCK829 (i.e., the victim super memory block) is located in the first plane PLANE1 of the zeroth memory die DIE0, the bad memory block of the 718^th super memory block SUPER BLOCK718 (i.e. the previous target super memory block) is located in the first plane PLANE1 of the first memory die DIE1, and the bad memory blocks of the bad 820^th super memory block SUPER BLOCK820 (i.e. the current target super memory block) are located in the first plane PLANE1 of the third memory die DIE3 and the first plane PLANE1 of the fourth memory die DIE4. That is to say, the location of the bad memory block of the 829^th super memory block SUPER BLOCK829 is a location that does not overlap with the locations of the bad memory blocks included in the 820^th super memory block SUPER BLOCK820 and the location of the bad memory block included in the 718^th super memory block SUPER BLOCK718.

Therefore, the controller 130 determines the 829^th super memory block SUPER BLOCK829 as the new victim super memory block, generates the reused super block table 700 such that the memory block included in the first plane PLANE1 of the first memory die DIE1, the memory block included in the first plane PLANE1 of the third memory DIE3 and the memory block included in the first plane PLANE1 of the fourth memory die DIE4 among the 32 memory blocks included in the 829^th super memory block SUPER BLOCK829 (i.e., the victim super memory block) may be used in the 820^th super memory block SUPER BLOCK820 (i.e. the current target super memory block).

Namely, in order to replace the 820^th super memory block SUPER BLOCK820, the controller 130 sets the second row of the reused super block table 700 as a first reused super memory block RE SUPER BLOCK1, and stores the respective block address values of 32 memory blocks for replacing the target super memory block i.e., the 820^th super memory block SUPER BLOCK820 according to the illustrated example of FIG. 7.

Thus, in the values of the first reused super memory block RE SUPER BLOCK1 stored in the second row of the reused super block table 700, only block addresses for indicating the memory block included in the first plane PLANE1 of the first memory die DIE1, the memory block included in the first plane PLANE1 of the third memory die DIE3 and the memory block included in the first plane PLANE1 of the fourth memory die DIE4 among the 32 memory blocks are the block addresses of the 829^th super memory block SUPER BLOCK829, and all the remaining 29 block addresses are the block addresses of the 820^th super memory block SUPER BLOCK820.

In this way, because the reused super block table 700 is generated, when the controller 130 accesses the 820^th super memory block SUPER BLOCK820, reference may be made to the values of the first reused super memory block RE SUPER BLOCK1 stored in the second row of the reused super block table 700.

Then, in order to reuse the bad 829^th super memory block SUPER BLOCK829 (i.e. the target super memory block), the controller 130 may replace the bad memory block included in the first plane PLANE1 of the zeroth memory die DIE0, the memory blocks included in the first planes PLANE1 of the first memory die DIE1, the memory block included in the first plane PLANE1 of the third memory die DIE3 and the memory block included in the first plane PLANE1 of the fourth memory die DIE4 among the 32 memory blocks included in the 829^th super memory block SUPER BLOCK829.

The reason why memory blocks capable of replacing four memory blocks among the 32 memory blocks included in the 829^th super memory block SUPER BLOCK829 are searched even though only a bad memory block is one among the 32 memory blocks included in the 829^th super memory block SUPER BLOCK829 resides in that three memory blocks of the 829^th super memory block SUPER BLOCK829 are used to normally operate the 820^th super memory block SUPER BLOCK820 as a reused super memory block. Specifically, as described above, because the bad memory block is included in the first plane PLANE1 of the first memory die DIE1 among the 32 memory blocks included in the 718^th super memory block SUPER BLOCK718 and the bad memory blocks are included in the first plane PLANE1 of the third memory die DIE3 and the first plane PLANE1 of the fourth memory die DIE4 among the 32 memory blocks included in the 820^th super memory block SUPER BLOCK820, the reused super block table 700 is generated to use the memory blocks included in the first plane PLANE1 of the first memory die DIE1, the first plane PLANE1 of the third memory die DIE3 and the first plane PLANE1 of the fourth memory die DIE4 among the 32 memory blocks included in the 829^th super memory block SUPER BLOCK829.

Hence, in order to reuse the bad 829^th super memory block SUPER BLOCK829, the controller 130 may search to find a victim super memory block having at least one bad memory block, among the super memory blocks SUPER BLOCK<0:1023>.

In the illustrated embodiment of FIG. 7, because the controller 130 cannot any longer find another victim super memory block, i.e., a super memory block having at least one bad memory block, the controller 130 does cannot reuse the bad 829^th super memory block SUPER BLOCK829.

Meanwhile, in the reused super block table 700 described above with reference to FIG. 7, there are included 32 memory block addresses for indicating the 32 memory blocks included in each of the reused super memory blocks RE SUPER BLOCK 0 and RE SUPER BLOCK 1. As exemplified in FIG. 7, block addresses for indicating 64 memory blocks are included for the reused super memory blocks RE SUPER BLOCK 0 and RE SUPER BLOCK 1 in the reused super block table 700.

In this way, in the case where a scheme in which block addresses are directly included in the reused super block table 700, because the block addresses occupy a substantially large space, a space to be used to store the reused super block table 700 markedly increases as the number of reused super memory blocks increases.

For example, when assuming that the size of a storage space needed to store one block address is 2 bytes, the size of block addresses for a single reused super memory block becomes 64 bytes in the reused super block table 700. The size of block addresses for 100 reused super memory blocks becomes 6,400 bytes, and the size of block addresses for 250 reused super memory blocks becomes 16,000 bytes.

The reused super block table 700 may be stored in the memory 144 of the controller 130 as described above with reference to FIG. 1. Memory 144 may be a volatile memory region, which means that it may be necessary for an efficient operation of the memory system 110 to retain minimally the size of a region where the reused super block table 700 is stored. In the embodiment of the present disclosure, the size of a region where the reused super block table 700 is stored is retained minimally by using a scheme as shown in FIG. 8.

Figure 8:
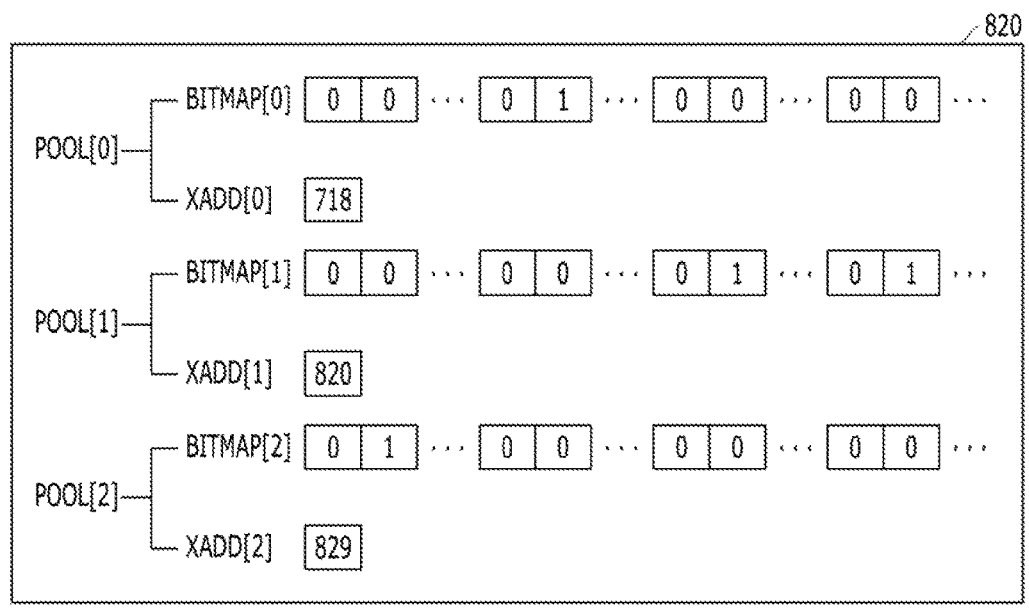
FIG. 8 is a diagram illustrating a method for reusing a bad super memory block, in which one or more bad memory blocks are included, in a memory system in accordance with the embodiment of the present invention.
Figure 8:
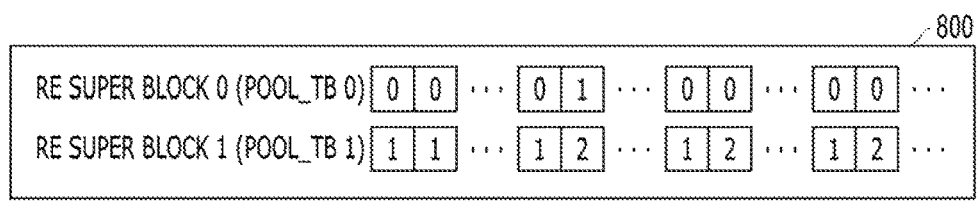

FIG. 8 is a diagram illustrating a method for reusing a bad super memory block, in which one or more bad memory blocks are included, in the memory system in accordance with another embodiment of the present invention.

FIG. 8 represents a case where the memory device 150 having several bad super memory blocks, as illustrated in FIG. 7. That is, one or more memory blocks among the 32 memory blocks included in each of the 718^th super memory block SUPER BLOCK718, the 820^th super memory block SUPER BLOCK820 and the 829^th super memory block SUPER BLOCK829 among the plurality of super memory blocks SUPER BLOCK<0:1023> included in the memory device 150 are determined as bad memory blocks.

In this state, the controller 130 may set and manages the bad super memory blocks (e.g., the bad super memory blocks SUPER BLOCK718, SUPER BLOCK820 and SUPER BLOCK829) through a bad block pool 820 in the form of bitmaps and indexes.

The bad block pool 820 may include a plurality of bad super memory block indexes POOL[0:2] corresponding to the bad super memory blocks, respectively. For example, FIG. 8 exemplifies the bad super memory block indexes POOL[0:2] respectively corresponding to the bad super memory blocks SUPER BLOCK718, SUPER BLOCK820 and SUPER BLOCK829. The bad super memory block indexes POOL[0:2] may be mapped to the super memory block addresses XADD[0:2] representing the corresponding bad super memory blocks and bad memory block information BITMAP[0:2] representing locations of the bad memory blocks included in the corresponding bad super memory blocks. The bad memory block information BITMAP[0:2] may be in the form of bitmaps.

For example, a first bad super memory block index POOL[0] may correspond to the bad 718^th super memory block SUPER BLOCK718. The first bad super memory block index POOL[0] may include the super memory block address XADD[0] having a value ("718") of the super memory block address of the bad 718^th super memory blocks SUPER BLOCK718. The first bad super memory block index POOL[0] may further include the bad memory block information BITMAP[0] representing the locations of the bad memory blocks included in the bad 718^th super memory blocks SUPER BLOCK718. As exemplified in FIG. 8, in the bad memory block information BITMAP[0] in the bitmap form, a value of "0" may represent a normal memory block and a value of "1" may represent the bad memory block. Since it is assumed that 32 memory blocks are included in a single super memory block, each of the bad memory block information BITMAP[0:2] in the bitmap form may represent 32 locations of the memory blocks included in the single super memory block and thus the value of "1" of the bad memory block information BITMAP[0:2] may represent the locations of the bad memory blocks included in the bad super memory blocks.

The controller 130 includes, in the bad block pool 820, bad super memory block indexes POOL[0:2] respectively representing the bad super memory blocks SUPER BLOCK718, SUPER BLOCK820 and SUPER BLOCK829, which are respectively indicated by the super memory block addresses XADD[0:2]. The controller 130 stores the locations of the normal memory blocks and the bad memory blocks included in the respective bad super memory blocks SUPER BLOCK718, SUPER BLOCK820 and SUPER BLOCK829, into the bad memory block information BIT- MAP[0:2] in the form of bitmaps, and includes the bad memory block information BITMAP[0:2] and the super memory block addresses XADD[0:2] In the bad block pool 820 in correspondence to the respective bad super memory block indexes POOL[0:2].

The controller 130 generates a reused super block table 800 representing the reused super memory blocks RE SUPER BLOCK 0 and RE SUPER BLOCK 1 through a plurality of set value tables POOL_TB[0:1]. The set value tables POOL_TB[0:1] may represent the reused super memory blocks RE SUPER BLOCK 0 and RE SUPER BLOCK 1 in the form of bitmap. Each bit in the bitmap of the set value tables POOL_TB[0:1] may represent a normal memory block of the bad super memory block through an index value of the bad super memory block indexes POOL [0:2]. For example, in the set value tables POOL_TB[0:1], bitmap values of "0" to "2" may represent normal memory blocks of the bad super memory blocks SUPER BLOCK718, SUPER BLOCK820 and SUPER BLOCK829, respectively.

The scheme of generating the reused super memory blocks RE SUPER BLOCK 0 and RE SUPER BLOCK 1 in the embodiment of FIG. 8 (i.e., the selecting of the victim super memory block for the target super memory block, and the replacing the bad memory block of the target super memory block with a normal memory block of the victim super memory block, thereby generating the reused super memory block) may be the same as described with reference to FIG. 7 except that the embodiment of FIG. 8 uses the bad memory block information BITMAP[0:2] and the index value of the bad super memory block indexes POOL[0:2].

In other words, the controller 130 may include, in the bad block pool 820, set values POOL[0:2] in the form of indexes corresponding to super block address informations XADD: 718, 820 and 829 respectively indicating the bad super memory blocks SUPER BLOCK718, SUPER BLOCK820 and SUPER BLOCK829. The controller 130 may change the positions of the normal memory blocks and the bad memory blocks included in the respective bad super memory blocks SUPER BLOCK718, SUPER BLOCK820 and SUPER BLOCK829, into position information BITMAP[0:2] in the form of bitmaps, and include the position information BITMAP[0:2] in the bad block pool 820 in correspondence to the respective set values POOL[0:2]. After checking the positions of the normal memory blocks included in the respective bad super memory blocks SUPER BLOCK718, SUPER BLOCK820 and SUPER BLOCK829, through the position information BITMAP[0:2] included in the bad block pool 820, the controller 130 may generates a plurality of set value tables POOL_TB[0:1] by grouping the set values POOL[0:2] corresponding to the respective checked position information BITMAP[0:2] by the unit of super memory block, and may store the set value tables POOL_TB [0:1] in the reused super block table 800 to manage the respective set value tables POOL_TB[0:1] as the reused super memory blocks RE SUPER BLOCK[0:1].

In detail, the controller 130 may generate the bad super memory block indexes POOL[0:2] corresponding to the super block address information XADD having values of 718, 820 and 829 indicating the respective 718ˆth super memory block SUPER BLOCK718, 820ˆth super memory block SUPER BLOCK820 and 829ˆth super memory block SUPER BLOCK829 determined as bad super memory blocks among the super memory blocks SUPER BLOCK<0: 1023>, and includes the bad super memory block indexes POOL[0:2] in the bad block pool 820.

For example, the controller 130 may generate the super block address information XADD having a value of 718 indicating the bad 718ˆth super memory block SUPER BLOCK718 in correspondence to the first bad super memory block index POOL[0] among the bad super memory block indexes POOL[0:2], and may store the first bad super memory block index POOL[0] in the bad block pool 820.

Then, the controller 130 may store the locations of the normal memory blocks and the bad memory blocks included in the 718ˆth super memory block SUPER BLOCK718, into the first bad memory block information BITMAP[0] among the bad memory block information BITMAP[0:2] of the form of bitmaps, and stores the first bad memory block information BITMAP[0] in the bad block pool 820 in correspondence to the first bad super memory block index POOL[0].

Since the memory block included in the first plane PLANE1 of the first memory die DIE1 among the 32 memory blocks included in the 718ˆth super memory block SUPER BLOCK718 is the only bad memory block and all the remaining 31 memory blocks are normal memory blocks, the first bad memory block information BITMAP[0] corresponding to the 718ˆth super memory block SUPER BLOCK718 has a single value of "1" at a bit location representing the only bad memory block.

Further, the controller 130 generates the super block address information XADD having a value of 820 indicating the 820ˆth super memory block SUPER BLOCK820 in correspondence to the second bad super memory block index POOL[1] among the bad super memory block indexes POOL[0:2], and stores the second bad super memory block index POOL[1] in the bad block pool 820.

The controller 130 stores the locations of the normal memory blocks and the bad memory blocks included in the 820ˆth super memory block SUPER BLOCK820, into the second bad memory block information BITMAP[1] among the bad memory block information BITMAP[0:2] of the form of bitmaps, and stores the second bad memory block information BITMAP[1] in the bad block pool 820 in correspondence to the second bad super memory block index POOL[1].

Since the memory blocks included in the first plane PLANE1 of the third memory die DIE3 and the first plane PLANE1 of the fourth memory die DIE4 among the 32 memory blocks included in the 820ˆth super memory block SUPER BLOCK820 are bad memory blocks and all the remaining 30 memory blocks are normal memory blocks, the second bad memory block information BITMAP[1] corresponding to the 820ˆth super memory block SUPER BLOCK820 has a two values of "1" at bit locations representing the bad memory blocks.

Furthermore, the controller 130 generates the super block address information XADD having a value of 829 indicating the 829ˆth super memory block SUPER BLOCK829 in correspondence to the third bad super memory block index POOL[2] among the bad super memory block indexes POOL[0:2], and stores the third bad super memory block index POOL[2] in the bad block pool 820.

The controller 130 may store the locations of the normal memory blocks and the bad memory blocks included in the 829ˆth super memory block SUPER BLOCK829, into the third bad memory block information BITMAP[2] among the bad memory block information BITMAP[0:2], and may store the third bad memory block information BITMAP[2] in the bad block pool 820 in correspondence to the third bad super memory block index POOL[2].

Since the memory block included in the first plane PLANE1 of the zeroth memory die DIE0 among the 32 memory blocks included in the 829^th super memory block SUPER BLOCK829 is the only bad memory block and all the remaining 31 memory blocks are normal memory blocks, the values of the third bad memory block information BITMAP[2] corresponding to the 829^th super memory block SUPER BLOCK829 has a single value of "1" at a bit location representing the only bad memory block.

As described above, the controller 130 generates all the bad super memory block indexes POOL[0:2] respectively corresponding to the 718^th super memory block SUPER BLOCK718, the 820^th super memory block SUPER BLOCK820 and the 829^th super memory block SUPER BLOCK829 determined as bad super memory blocks among the plurality of super memory blocks SUPER BLOCK<0: 1023> included in the memory device 150, and stores the bad super memory block indexes POOL[0:2] in the bad block pool 820. Also, the controller 130 stores the bad memory block information BITMAP[0:2] which are obtained by storing, in the form of bitmaps, the locations of the normal memory blocks and the bad memory blocks among the 32 memory blocks included in the 718^th super memory block SUPER BLOCK718, the 820^th super memory block SUPER BLOCK820 and the 829^th super memory block SUPER BLOCK829 which are determined as bad super memory blocks, in the bad block pool 820 in correspondence to the bad super memory block indexes POOL[0:2].

In this way, after all of the bad super memory block indexes POOL[0:2] and the bad memory block information BITMAP[0:2] corresponding to the bad super memory blocks among the plurality of super memory blocks SUPER BLOCK<0:1023> included in the memory device 150 are stored in the bad block pool 820, the controller 130 generates the reused super block table 800 by referring to the bad block pool 820.

In detail, in order to reuse the bad 718^th super memory block SUPER BLOCK718, the controller 130 selects a victim super memory block from remaining bad memory block information BITMAP[1:2] corresponding to remaining bad super memory block indexes POOL[1:2] other than the first bad memory block information BITMAP[0] corresponding to the first bad super memory block index POOL [0] among the bad super memory block indexes POOL[0:2] stored in the bad block pool 820.

In other words, the controller 130 selects a victim super memory block for replacing the bad memory block included in the first plane PLANE1 of the first memory die DIE1 among the 32 memory blocks included in the 718^th super memory block SUPER BLOCK718 (i.e. the target super memory block).

For example, the locations of '1' indicating bad memory blocks in the first bad memory block information BITMAP [0] corresponding to the first bad super memory block index POOL[0] and in the second bad memory block information BITMAP[1] corresponding to the second bad super memory block index POOL[1]do not overlap with each other.

Therefore, the controller 130 selects as a victim super memory block the 820^th super memory block SUPER BLOCK820 corresponding to the second bad super memory block index POOL[1], and generates the reused super block table 800 such that the memory block included in the first plane PLANE1 of the first memory die DIE1 among the 32 memory blocks included in the 820^th super memory block SUPER BLOCK820 (i.e., the victim super memory block) may be used in the 718^th super memory block SUPER BLOCK718 (i.e. the target super memory block).

Namely, in order to replace the 718^th super memory block SUPER BLOCK718, the controller 130 sets the first row of the reused super block table 800 as a zeroth reused super memory block RE SUPER BLOCK0 by generating a first set value table POOL_TB[0] in the form of bitmap. Each length of the set value tables POOL_TB[0:1] may represent a number of memory blocks included in a single super memory block. For example, a length of the respective set value tables POOL_TB[0:1] may be 32 bits representing 32 memory blocks included in the respective bad super memory blocks SUPER BLOCK718, SUPER BLOCK820 and SUPER BLOCK829. Each bit in the bitmap of the first set value table POOL_TB[0] may represent the normal memory block of the bad super memory block through the index value of the bad super memory block indexes POOL [0:2]. For example, in the set value tables POOL_TB[0:1], bitmap values of "0" to "2" may represent a normal memory block of the bad super memory blocks SUPER BLOCK718, SUPER BLOCK820 and SUPER BLOCK829, respectively.

Referring to the reused super block table 800 of FIG. 8, the first set value table POOL_TB[0] has a value of "1" representing a normal memory block of the 820^th super memory block SUPER BLOCK820, which represents the replacement relationship of a bad memory block and a normal memory block between the target super memory block (i.e., the 718^th super memory block SUPER BLOCK718) and the victim super memory block (i.e., the 820^th super memory block SUPER BLOCK820). In the first set value table POOL_TB[0], the value of "1" represent that a bad memory block (i.e., the memory block included in the first plane PLANE1 of the first memory die DIE1) of the target super memory block (i.e., the 718^th super memory block SUPER BLOCK718) is replaced by a normal memory block (i.e., the memory block included in the first plane PLANE1 of the first memory die DIE1) of the victim super memory block (i.e., the 820^th super memory block SUPER BLOCK820) of the same location represented by the bit location of the value of "1".

As described above, the controller 130 does not store the respective block address values of 32 memory blocks for replacing the bad 718^th super memory block SUPER BLOCK718, in the reused super block table 800. Instead, the controller 130 generates the first set value table POOL_TB [0] by grouping a value of "O0" representing the first bad super memory block index POOL[0] corresponding to the 718^th super memory block SUPER BLOCK718 and a value of "1" representing the second bad super memory block index POOL[1] corresponding to the 820^th super memory block SUPER BLOCK820 in units of super memory blocks, and stores the first set value table POOL_TB[0] as the first row of the reused super block table 800. At the same time, the controller 130 sets the first row of the reused super block table 800 as the zeroth reused super memory block RE SUPER BLOCK0 for replacing the bad 718^th super memory block SUPER BLOCK718.

Thus, in the first row of the reused super block table 800, the zeroth reused super memory block RE SUPER BLOCK0 for replacing the 718^th super memory block SUPER BLOCK718 is set, and the first set value table POOL_TB[0] is stored as the values of the zeroth reused super memory block RE SUPER BLOCK0.

In this way, because the reused super block table 800 is generated, when the controller 130 accesses the 718^th super memory block SUPER BLOCK718, reference may be made to the values of the zeroth reused super memory block RE SUPER BLOCK0 stored in the first row of the reused super block table 800, that is, the first set value table POOL_TB [0], and then, the first bad super memory block index POOL[0] and the second bad super memory block index POOL[1] may be found. This means that it is possible to find the super memory block address indicating the 718^th super memory block SUPER BLOCK718, which are included in the first bad super memory block index POOL[0], and the super memory block address indicating the 820^th super memory block SUPER BLOCK820, which is included in the second bad super memory block index POOL[1].

Namely, when referring to the values of the zeroth reused super memory block RE SUPER BLOCK0 stored in the first row of the reused super block table 800, that is, the first set value table POOL_TB[O0], 32 block addresses corresponding to the respective 32 memory blocks included in the 718^th super memory block SUPER BLOCK718 may be found through the bad block pool 820.

Further, in order to reuse the bad 820^th super memory block SUPER BLOCK820, the controller 130 selects a victim super memory block from remaining bad memory block information BITMAP[2] corresponding to the remaining bad super memory block index POOL[2] other than the first and second bad memory block information BITMAP [0:1] obtained by combining the first bad memory block information BITMAP[0] corresponding to the first bad super memory block index POOL[0] and the second bad memory block information BITMAP[1] corresponding to the second bad super memory block index POOL[1] among the bad super memory block indexes POOL[0:2] stored in the bad block pool 820.

In other words, the controller 130 selects a victim super memory block for replacing the memory block included in the first plane PLANE1 of the first memory die DIE1, the bad memory block included in the first plane PLANE1 of the third memory die DIE3 and the bad memory block included in the first plane PLANE1 of the fourth memory die DIE4 among the 32 memory blocks included in the 820^th super memory block SUPER BLOCK820 (i.e. the target super memory block).

As described above, the memory block of the bad 820^th super memory block SUPER BLOCK820 included in the first plane PLANE1 of the first memory die DIE1 is taken for the reused super memory block RE SUPER BLOCK0, and thus the bad 820^th super memory block SUPER BLOCK820 requires a normal memory block for the taken memory block as well as the bad memory blocks included therein.

For example, the locations of '1' indicating bad memory blocks in the bad memory block information BITMAP[0:1] obtained by combining the first bad memory block information BITMAP[0] corresponding to the first bad super memory block index POOL[0] and the second bad memory block information BITMAP[1] corresponding to the second bad super memory block index POOL[1] and in the third bad memory block information BITMAP[2] corresponding to the third bad super memory block index POOL[2] do not overlap with each other.

Therefore, the controller 130 selects as a victim super memory block the 829^th super memory block SUPER BLOCK829 corresponding to the third bad super memory block index POOL[2], and generates the reused super block table 800 such that the memory block included in the first plane PLANE1 of the first memory die DIE1, the memory block included in the first plane PLANE1 of the third memory DIE3 and the memory block included in the first plane PLANE1 of the fourth memory die DIE4 among the 32 memory blocks included in the 829^th super memory block SUPER BLOCK829 (i.e., the victim super memory block) may be used in the 820^th super memory block SUPER BLOCK820 (i.e. the target super memory block).

Namely, in order to replace the 820^th super memory block SUPER BLOCK820, the controller 130 sets the second row of the reused super block table 800 as a first reused super memory block RE SUPER BLOCK1 by generating a second set value table POOL_TB[1] in the form of bitmap. Each bit in the bitmap of the second set value table POOL_TB[1] may represent the normal memory block of the bad super memory block through the index value of the bad super memory block indexes POOL[0:2].

Referring to the reused super block table 800 of FIG. 8, the second set value table POOL_TB[1] has a value of "2" representing a normal memory block of the 829^th super memory block SUPER BLOCK829, which represents the replacement relationship of a bad memory block, the taken memory block and a normal memory block between the target super memory block (i.e., the 820^th super memory block SUPER BLOCK820) and the victim super memory block (i.e., the 829^th super memory block SUPER BLOCK829). In the second set value table POOL_TB[1], the value of "2" represent that the taken memory block (i.e., the memory block included in the first plane PLANE1 of the first memory die DIE1) and the bad memory blocks (i.e., the memory blocks included in the first plane PLANE1 of the third memory die DIE3 and the first plane PLANE1 of the fourth memory die DIE4) of the target super memory block (i.e., the 820^th super memory block SUPER BLOCK820) are replaced by normal memory blocks (i.e., the memory block included in the first plane PLANE1 of the first memory die DIE1, the first plane PLANE1 of the third memory die DIE3 and the first plane PLANE1 of the fourth memory die DIE4) of the victim super memory block (i.e., the 829^th super memory block SUPER BLOCK829) of the same location represented by the bit location of the value of "2".

As described above, the controller 130 does not store the respective block address values of 32 memory blocks for replacing the bad 820^th super memory block SUPER BLOCK820, in the reused super block table 800. Instead, the controller 130 generates the second set value table POOL_TB[1] by grouping a value of "1" representing the second bad super memory block index POOL[1] corresponding to the 820^th super memory block SUPER BLOCK820 and a value of "2" representing the third bad super memory block index POOL[2] corresponding to the 829^th super memory block SUPER BLOCK829 in units of super memory blocks, and stores the second set value table POOL_TB[1], as the second row of the reused super block table 800. At the same time, the controller 130 sets the second row of the reused super block table 800 as a first reused super memory block RE SUPER BLOCK1 for replacing the bad 820^th super memory block SUPER BLOCK820.

Thus, in the second row of the reused super block table 800, the first reused super memory block RE SUPER BLOCK1 for replacing the 820^th super memory block SUPER BLOCK820 is set, and the second set value table POOL_TB[1] is stored as the values of the first reused super memory block RE SUPER BLOCK1.

In this way, because the reused super block table 800 is generated, when the controller 130 accesses the 820^th super memory block SUPER BLOCK820, reference may be made to the values of the first reused super memory block RE SUPER BLOCK1 stored in the second row of the reused super block table 800, that is, the second set value table POOL_TB[1], and then, the second bad super memory block index POOL[1] and the third bad super memory block index POOL[2] may be found. This means that it is possible to find the super memory block address indicating the 820^th super memory block SUPER BLOCK820, which are included in the second bad super memory block index POOL[1], and the super memory block address indicating the 829^th super memory block SUPER BLOCK829, which are included in the third bad super memory block index POOL[2].

Namely, when referring to the values of the first reused super memory block RE SUPER BLOCK1 stored in the second row of the reused super block table 800, that is, the second set value table POOL_TB[1], 32 block addresses corresponding to the respective 32 memory blocks included in the 820^th super memory block SUPER BLOCK820 may be found through the bad block pool 820.

Furthermore, in order to reuse the bad 829^th super memory block SUPER BLOCK829, the controller 130 selects a victim super memory block from remaining bad memory block information (which do not exist) corresponding to remaining bad super memory block indexes (which do not exist) other than the bad memory block information BITMAP[0:2] obtained by combining the first bad memory block information BITMAP[0] corresponding to the first bad super memory block index POOL[0], the second bad memory block information BITMAP[1] corresponding to the second bad super memory block index POOL[1] and the third bad memory block information BITMAP[2] corresponding to the third bad super memory block index POOL[2] among the bad super memory block indexes POOL[0:2] stored in the bad block pool 820. However, in the embodiment illustrated in FIG. 8, it may be seen that, since the third bad super memory block index POOL[2] is the last bad super memory block index, the remaining bad super memory block indexes as search targets do not exist.

Accordingly, the controller 130 does not reuse the bad 829^th super memory block SUPER BLOCK829.

As described above, in the reused super block table 800 set as in FIG. 8, there are included, in the form of a table, 32 bad super memory block indexes for indicating the 32 memory blocks included in each of super memory blocks to be reused. The respective 32 bad super memory block indexes may be changed into memory block addresses by referring to the bad block pool 820 including the super memory block address and the reused super block table 800 including specific location information of normal memory blocks of the respective super memory blocks. For example, in FIG. 8, 64 bad super memory block indexes are included to reuse the two super memory blocks SUPER BLOCK718 and SUPER BLOCK820, and may be respectively changed into memory block addresses for indicating 64 memory blocks, through the bad block pool 820 including the super memory block address and the reused super block table 800 including specific location information of normal memory blocks of the respective super memory blocks.

This means that it is possible to anticipate the same effects as in the case of directly storing 32 block addresses for indicating the 32 memory blocks included in each of super memory blocks to be reused, in the reused super block table 700, and searching the 32 block addresses as described above with reference to FIG. 7.

In the case of using the scheme in which bad super memory block indexes are included in the reused super block table 800 and the included bad super memory block indexes are changed into memory block addresses through the bad block pool 820 and the reused super block table 800 as in FIG. 8, since the size of a bad super memory block index occupies a relatively smaller space than the size of a memory block address, it is possible to use a smaller space than in the case of using the reused super block table 700 described above with reference to FIG. 7 even though the number of super memory blocks to be reused increases.

For example, when assuming that the size of a storage space needed to store one bad super memory block index is 1 byte and the size of a storage space needed to store one block address is 2 bytes, since the size of the bad super memory block indexes stored in the reused super block table 800 to reuse one super memory block is 32 bytes, the size of one location information corresponding to one bad super memory block index stored in the bad block pool 820 to reuse one super memory block is 32 bits (4 bytes) and the size of one block address is 2 bytes, total 38 bytes are needed. It may be seen that this value is remarkably decreased when compared to 64 bytes needed in the scheme described above with reference to FIG. 7.

Moreover, since the size of the bad super memory block indexes stored in the reused super block table 800 to reuse 100 super memory blocks is 3,200 bytes, the size of 100 bad memory block information corresponding to 100 bad super memory block indexes stored in the bad block pool 820 to reuse 100 super memory blocks is 3,200 bits (400 bytes) and the size of 100 block addresses is 200 bytes, total 3,800 bytes are needed. It may be seen that this value is remarkably decreased when compared to 6400 bytes needed in the scheme described above with reference to FIG. 7.

Similarly, since the size of the bad super memory block indexes stored in the reused super block table 800 to reuse 250 super memory blocks is 8,000 bytes, the size of 250 location information corresponding to 250 bad super memory block indexes stored in the bad block pool 820 to reuse 250 super memory blocks is 8,000 bits (1,000 bytes) and the size of 250 block addresses is 500 bytes, total 9,500 bytes are needed. It may be seen that this value is remarkably decreased when compared to 16,000 bytes needed in the scheme described above with reference to FIG. 7.

For reference, the reason why the size of bad super memory block indexes is relatively smaller than the size of block addresses resides in that the number of bad super memory block indexes stored in the form of indexes in the bad block pool 820 corresponds to the number of super memory blocks determined as bad super memory blocks among the plurality of super memory blocks included in the memory device 150 whereas the size of block addresses corresponds to the total number of the plurality of super memory blocks included in the memory device 150.

In the bad super memory block indexes POOL[0:2] stored in the form of indexes in the bad block pool 820, there are included the address information XADD having values of 718, 820 and 829 and the bad memory block information BITMAP[0:2]. In other words, in one bad super memory block index POOL[0], POOL[1] or POOL[2], one address information XADD having values of 718, 820 or 829 and one bad memory block information BITMAP[0], BITMAP[1] or BITMAP[2] are included.

The address information XADD having values of 718, 820 and 829 included in the bad super memory block indexes POOL[0:2] are used in the process of generating the reused super block table 800, that is, in the process of determining the values of the set value tables POOL_TB[0:1], and is used after the reused super block table 800 is generated, that is, after all the values of the set value tables POOL_TB[0:1] are determined.

However, the bad memory block information BITMAP[0:2] included in the bad super memory block indexes POOL[0:2] are used only in the process of generating the reused super block table 800, that is, in the process of determining the values of the set value tables POOL_TB[0:1], and is not used any more after the reused super block table 800 is generated, that is, after all the values of the set value tables POOL_TB[0:1] are determined.

Therefore, after the reused super block table 800 is generated, that is, after all the values of the set value tables POOL_TB[0:1] are determined, the controller 130 may leave only the address information XADD having values of 718, 820 and 829 in the bad super memory block indexes POOL[0:2] and erase the bad memory block information BITMAP[0:2].

Of course, there may be a case in which, after the reused super block table 800 is generated, that is, after all the values of the set value tables POOL_TB[0:1] are determined, the bad memory block information BITMAP[0:2] included in the bad super memory block indexes POOL[0:2] may be reused. For example, a new bad memory block may occur in the memory device 150 while mounting and using the memory system 110 for a certain period. Namely, there may be a case where a memory block which is determined as a normal memory block in the process of generating the reused super block table 800, that is, in the process of determining the values of the set value tables POOL_TB[0:1], may be changed to a bad memory block while the memory system 110 is used after being mounted, and the controller 130 may check this and perform an operation of generating again the reused super block table 800.

That is to say, there may be a case where, while the memory system 110 is used after being mounted, the controller 130 performs an operation of checking periodically whether a bad memory block occurs in the memory device 150 and performs an operation of generating again the reused super block table 800 according to occurrence of a bad memory block.

In such a case, even after the reused super block table 800 is generated, that is, even after all the values of the set value tables POOL_TB[0:1] are determined, the controller 130 may retain both the address information XADD having values of 718, 820 and 829 and the bad memory block information BITMAP[0:2], in the bad super memory block indexes POOL[0:2].

In this state, the controller 130 checks whether there exists a super memory block which should be included additionally in bad super memory blocks, among the super memory blocks SUPER BLOCK<0:1023>. Namely, the controller 130 checks whether there exists a memory block which is previously a normal memory block and is newly converted into a bad memory block, among the plurality of memory blocks BLOCK<0:1023> included in the memory device 150.

As a result of checking, in the case where there exists a super memory block which should be included additionally in bad super memory blocks, among the super memory blocks SUPER BLOCK<0:1023>, the normal memory blocks included in the respective bad super memory blocks are checked again through the bad memory block information BITMAP[0:2] of the bad block pool 820, and the set value tables POOL_TB[0:1] are generated again by grouping, in units of super memory blocks, the bad super memory block indexes POOL[0:2] corresponding to the respective bad memory block information BITMAP[0:2] checked again. Then, the set value tables POOL_TB[0:1] generated again are stored in the reused super block table 800 to be managed as the reused super memory blocks RE SUPER BLOCK[0:1].

While it is assumed in the above-described embodiment that the size of a storage space needed to store one bad super memory block index is 1 byte, this results from the assumption that the maximum number of bad super memory block indexes stored in the bad block pool 820 is 256 (2^8).

Figure 9:
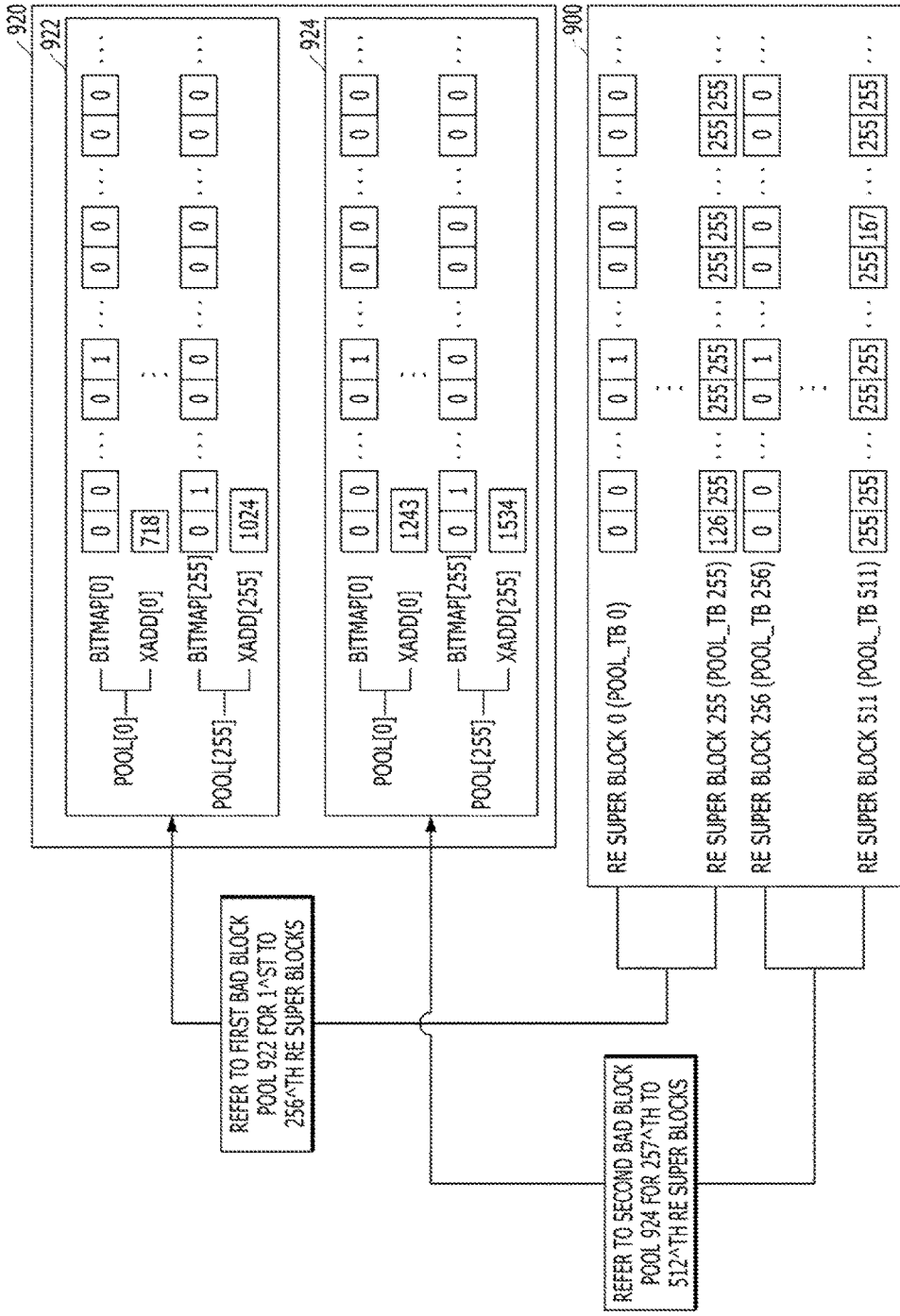
FIG. 9 is a diagram illustrating a method for reusing a bad super memory block, in which one or more bad memory blocks are included, in a memory system in accordance with yet another embodiment of the present invention.

If it is required that the number of bad super memory block indexes stored in the bad block pool 820 be set to be larger than 256, while there is a method of increasing one bit by one bit the size of a storage space needed to store one bad super memory block index, a method of managing the bad block pool 820 by dividing it into groups as illustrated in FIG. 9 without increasing the size of a storage space needed to store one bad super memory block index may be used.

FIG. 9 is a diagram illustrating a method for reusing a bad super memory block having one or more bad memory blocks, in the memory system in accordance with still another embodiment of the present invention.

A bad block pool 920 and a reused super block table 900 shown in FIG. 9 are the same as the bad block pool 820 and the reused super block table 800 shown in FIG. 8 except that the bad block pool 920 of FIG. 9 includes a plurality of bad block pools, for example, first and second bad block pools 922 and 924. Each of the first and second bad block pools 922 and 924 may store 256 bad super memory block indexes. Each of the first and second bad block pools 922 and 924 may be the same as the bad block pool 820 and the reused super block table 800 shown in FIG. 8. The total number of the bad super memory block indexes stored in the bad block pool 920 is 512.

Accordingly, in FIG. 9, a total of 512 set value tables are stored in the reused super block table 900. That is to say, in FIG. 9, a total of 512 reused super memory blocks may be managed in the reused super block table 900.

In other words, FIG. 9 illustrates how the reused super block table 900 and the bad block pool 920 are managed in the case where the number of bad super memory blocks is relatively large.

In detail, while the total number of the bad super memory block indexes stored in the bad block pool 920 is 512, the same bad super memory block index system may be used in each of the first and second bad block pools 922 and 924, and storage spaces are separated not to overlap with each other.

That is to say, 256 bad super memory block indexes POOL[0:255] may be stored in the first bad block pool 922 for bad 718^th to 1024^th super memory blocks, and the same bad super memory block indexes POOL[0:255] may be stored in the second bad block pool 924 for bad 1243^th to 1534^th super memory blocks.

In this state, the bad super memory block indexes included in the first to 256^th set value tables POOL_TB 0 to 255 among the 512 set value tables POOL_TB 0 to 511 stored in the reused super block table 900 replace block addresses by referring to the first bad block pool 922.

Similarly, the bad super memory block indexes included in the 257^th to 512^th set value tables POOL_TB 256 to 511 among the 512 set value tables POOL_TB 0 to 511 stored in the reused super block table 900 may replace block addresses by referring to the second bad block pool 924.

As described above, as the bad super memory block indexes stored in the bad block pool 920 are divisionally stored based on 256 bad super memory block indexes and storage spaces to access are set to be different according to the sequence in which the bad super memory block indexes are stored in the reused super block table 900, it is possible to use the scheme of changing bad super memory block indexes into block addresses as described above with reference to FIG. 8 without increasing the size of a storage space needed to store each bad super memory block index.

FIGS. 10 to 18 are diagrams schematically illustrating application examples of the data processing system of FIG. 1.

Figure 10:
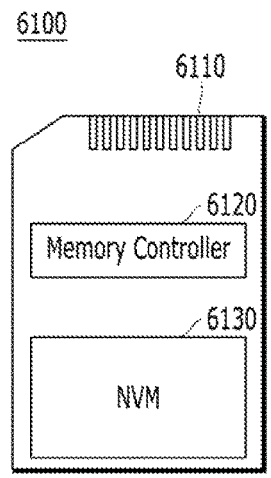
FIGS. 10 to 18 are diagrams schematically illustrating application examples of the data processing system of FIG. 1 in accordance with various embodiments of the present invention.

FIG. 10 is a diagram schematically illustrating another example of the data processing system including the memory system in accordance with the present embodiment. FIG. 10 schematically illustrates a memory card system to which the memory system in accordance with the present embodiment is applied.

Referring to FIG. 10, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 and the memory device 6130 may correspond to the controller 130 and the memory device 150 of the memory system 110, respectively, which are described earlier with reference to FIGS. 1 to 9.

Thus, the memory controller 6120 may include a RAM, a processing unit, a host interface, a memory interface and an error correction unit.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 11:
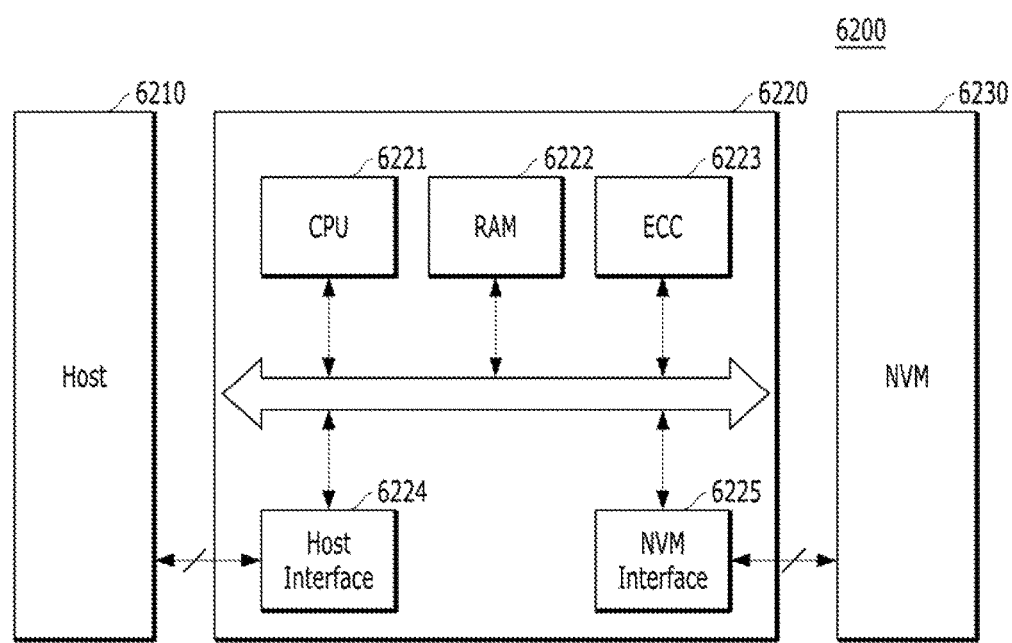

FIG. 11 is a diagram schematically illustrating another example of the data processing system including the memory system in accordance with the present embodiment.

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (CF, SD, micro-SD or the like) or USB device, as described with reference to FIG. 1. The memory controller 6220 and the memory device 6230 may correspond to the controller 130 and the memory device 150 of the memory system 110, respectively, which are described earlier with reference to FIGS. 1 to 9. The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit which may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/ receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 12:
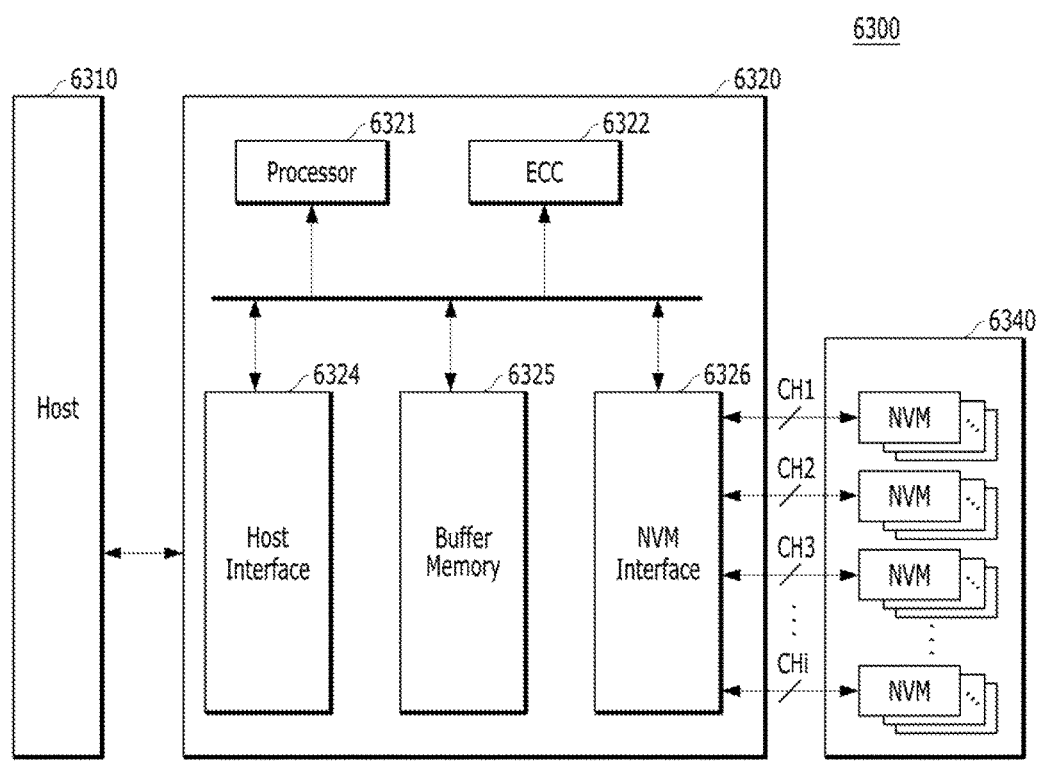

FIG. 12 is a diagram schematically illustrating another example of the data processing system including the memory system in accordance with the present embodiment. FIG. 12 schematically illustrates an SSD to which a memory system in accordance with the present embodiment is applied.

Referring to FIG. 12, the SSD 6300 may include a controller 6320 and a memory device 6340 including a plurality of nonvolatile memories. The controller 6320 and the memory device 6340 may correspond to the controller 130 and the memory device 150 of the memory system 110, respectively, which are described earlier with reference to FIGS. 1 to 9.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 12 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
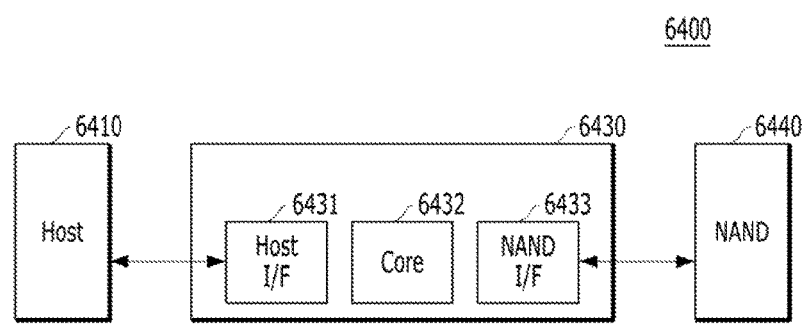

FIG. 13 is a diagram schematically illustrating another example of the data processing system including a memory system in accordance with an embodiment. FIG. 13 schematically illustrates an embedded Multi-Media Card (eMMC) to which a memory system in accordance with an embodiment is applied.

Referring to FIG. 13, the eMMC 6400 may include a controller 6430 and a memory device 6440 embodied by one or more NAND flash memories. The controller 6430 and the memory device 6440 may correspond to the controller 130 and the memory device 150 of the memory system 110, respectively, which are described earlier with reference to FIGS. 1 to 9.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 14 to 17 are diagrams schematically illustrating other examples of the data processing system including the memory system in accordance with the present embodiment. FIGS. 14 to 17 schematically illustrate UFS (Universal Flash Storage) systems to which the memory system in accordance with the present embodiment is applied.

Referring to FIGS. 14 to 17, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 described in FIGS. 1 to 9. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 11 to 13, and the UFS cards 6530, 6630, 6730 and 6830 may be embodied in the form of the memory card system 6100 described with reference to FIG. 10.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 14:
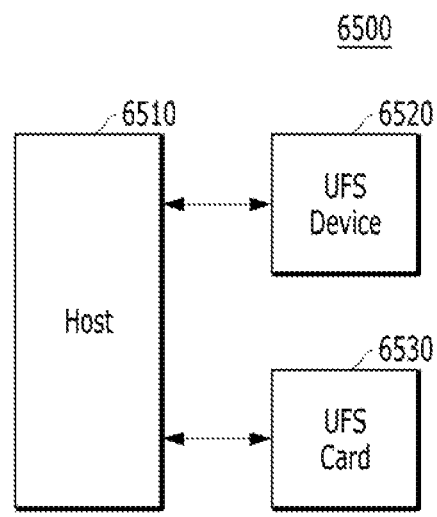

In the UFS system 6500 illustrated in FIG. 14, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 15:
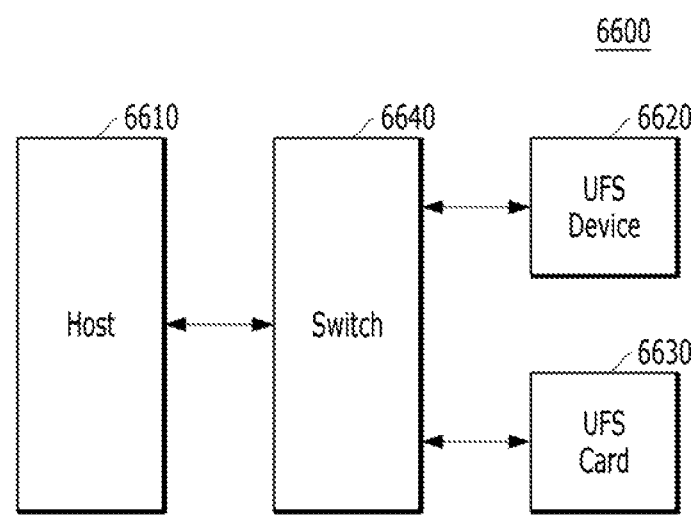

In the UFS system 6600 illustrated in FIG. 15, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 16:
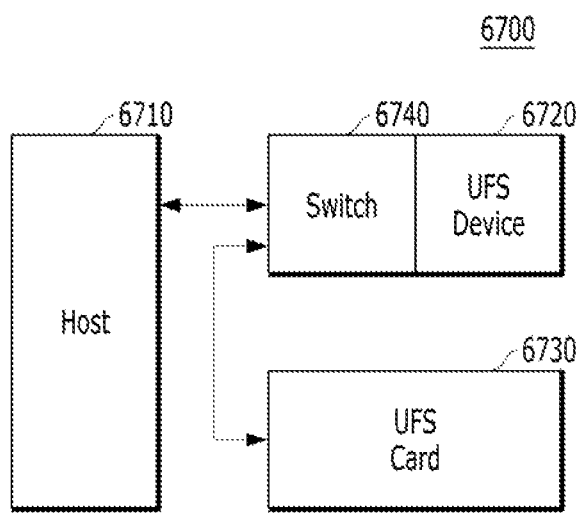

In the UFS system 6700 illustrated in FIG. 16, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 17:
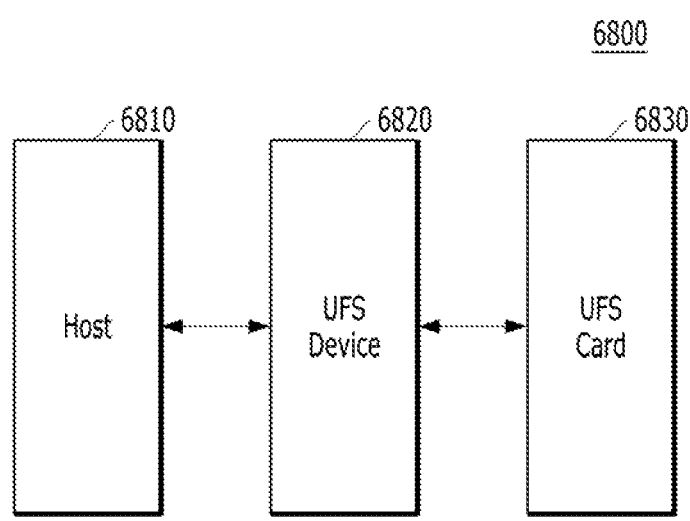

In the UFS system 6800 illustrated in FIG. 17, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 18:
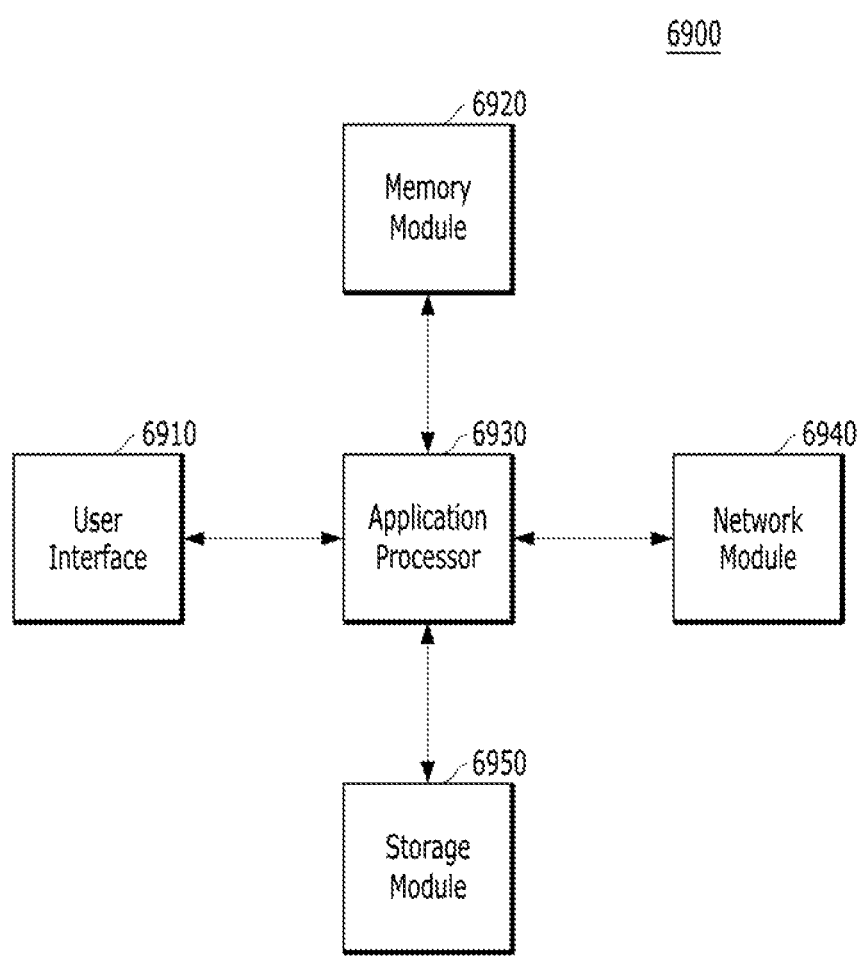

FIG. 18 is a diagram schematically illustrating another example of the data processing system including the memory system in accordance with an embodiment of the present invention. FIG. 18 is a diagram schematically illustrating a user system to which a memory system in accordance with an embodiment is applied.

Referring to FIG. 18, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 to 9. Furthermore, the storage module 6950 may be embodied as an SSD, eMMC and UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 5 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

In the present technology, when managing the plurality of memory blocks included in a memory device in units of super memory blocks the information of bad super memory blocks may be managed by a bad block pool in the form of a bitmap and an index.

Through this, it is possible to minimize the size of a management region which is needed to manage the information of the bad super memory blocks.

Although various embodiments have been described for illustrative purposes, it will be apparent to those skilled in the art that various other embodiments, changes and modifications thereof may be made without departing from the spirit and scope of the invention as defined in the following claims.

What is claimed is:

1. A memory system comprising:
   a memory device including a plurality of memory blocks; and
   a controller suitable for managing the memory blocks as a plurality of super memory blocks by grouping the memory blocks according to a predetermined condition, managing a bad block pool including bitmaps and indexes by setting super memory blocks having one or more bad memory blocks as bad super memory blocks, and managing reused super memory blocks by checking, through the bad block pool, normal memory blocks included in the respective bad super memory blocks and then performing grouping according to the predetermined condition,
   wherein each of the bitmaps included the bad block pool corresponds to each of the bad super memory blocks, and each bit in said each of the bitmaps corresponds to the normal block or the bad block of the bad super memory block.

2. The memory system according to claim 1,
   wherein the controller includes set values including of indexes corresponding to super block address informations indicating the respective bad super memory blocks, in the bad block pool, and
   wherein the controller changes positions of normal memory blocks and bad memory bocks included in the respective bad super memory blocks, into bad memory block management information including the bitmaps, and includes the bad memory block management information in the bad block pool in correspondence to the respective set values.

3. The memory system according to claim 2, wherein, after checking the positions of the normal memory blocks included in the respective bad super memory blocks, through the bad memory block management information included in the bad block pool, the controller generates a plurality of set value tables by grouping the set values corresponding to the respective checked bad memory block management information according to the predetermined condition, and manages the respective set value tables as the reused super memory blocks.

4. The memory system according to claim 3,
   wherein the controller erases the bad memory block management information included in the bad block pool, after generating the set value tables.

5. The memory system according to claim 3,
   wherein the controller retains the bad memory block management information included in the bad block pool, even after generating the set value tables, and
   wherein, in the case where a super memory block which should be included additionally in the bad super memory blocks exists among the super memory blocks, the controller checks again normal memory blocks included in the respective bad super memory blocks, through the bad memory block management information of the bad block pool, generates again the set value tables by grouping again the set values corresponding to the bad memory block management information checked again, according to the predetermined condition, and manages the set value tables generated again, as the reused super memory blocks.

6. The memory system according to claim 1, wherein the memory device further includes:
   a plurality of planes respectively corresponding to a plurality of ways capable of inputting/outputting data in an interleaving scheme through sharing one channel, and respectively including the memory blocks; and
   a plurality of memory dies respectively corresponding to a plurality of channels capable of inputting/outputting data in an interleaving scheme, and respectively including the planes.

7. The memory system according to claim 6, wherein the controller includes, in the predetermined condition, grouping one optional memory block included in a first plane of any one memory die among the memory dies and one optional memory block included in a second plane.

8. The memory system according to claim 6, wherein the controller includes, in the predetermined condition, grouping one optional memory block included in a first plane of a first memory die among the memory dies and one optional memory block included in a first plane of a second memory die, and grouping one optional memory block included in a second plane of the first memory die and one optional memory block included in a second plane of the second memory die.

9. The memory system according to claim 6, wherein the controller includes, in the predetermined condition, grouping one optional memory block included in a first plane of a first memory die among the memory dies, one optional memory block included in a second plane of the first memory die, one optional memory block included in a first plane of a second memory die and one optional memory block included in a second plane of the second memory die.

10. A method for operating a memory system including a memory device which includes a plurality of memory blocks, comprising:
    managing the memory blocks as a plurality of super memory blocks by grouping the memory blocks according to a predetermined condition;
    managing a bad block pool including bitmaps and indexes by setting super memory blocks having one or more bad memory blocks, as bad super memory blocks; and
    managing reused super memory blocks by checking, through the bad block pool, normal memory blocks included in the respective bad super memory blocks and then performing grouping according to the predetermined condition,
    wherein each of the bitmaps included the bad block pool corresponds to each of the bad super memory blocks, and each bit in said each of the bitmaps corresponds to the normal block or the bad block of the bad super memory block.

11. The method according to claim 10, wherein the managing of the bad block pool comprises:
    including set values including of indexes corresponding to super block address informations indicating the respective bad super memory blocks, in the bad block pool; and
    changing positions of normal memory blocks and bad memory bocks included in the respective bad super memory blocks, into bad memory block management information including the bitmaps, and including the bad memory block management information in the bad block pool in correspondence to the respective set values.

12. The method according to claim 11, wherein the managing of the reused super memory blocks comprises:
    checking the positions of the normal memory blocks included in the respective bad super memory blocks, through the bad memory block management information included in the bad block pool; and
    generating a plurality of set value tables by grouping the set values corresponding to the respective bad memory block management information checked in the checking, according to the predetermined condition, and managing the respective set value tables as the reused super memory blocks.

13. The method according to claim 12, further comprising:
    erasing the bad memory block management information included in the bad block pool, after generating the set value tables in the managing of the reused super memory blocks.

14. The method according to claim 12, further comprising:
    retaining the bad memory block management information included in the bad block pool, after generating the set value tables in the managing of the reused super memory blocks and
    wherein the managing of the reused super memory blocks comprises:
    checking again, in the case where, after the retaining, a super memory block which should be included additionally in the bad super memory blocks exists among the super memory blocks, normal memory blocks included in the respective bad super memory blocks, through the bad memory block management information of the bad block pool; and
    generating again the set value tables by grouping again the set values corresponding to the bad memory block management information checked again in the checking again, according to the predetermined condition, and managing the set value tables generated again, as the reused super memory blocks.

15. The method according to claim 10, wherein a plurality of planes respectively corresponding to a plurality of ways capable of inputting/outputting data in an interleaving scheme through sharing one channel and respectively including the memory blocks, and a plurality of memory dies respectively corresponding to a plurality of channels capable of inputting/outputting data in an interleaving scheme and respectively including the planes are additionally included in the memory device.

16. The method according to claim 15, wherein the predetermined condition includes grouping one optional memory block included in a first plane of any one memory die among the memory dies and one optional memory block included in a second plane.

17. The method according to claim 15, wherein the predetermined condition includes grouping one optional memory block included in a first plane of a first memory die among the memory dies and one optional memory block included in a first plane of a second memory die, and grouping one optional memory block included in a second plane of the first memory die and one optional memory block included in a second plane of the second memory die.

18. The method according to claim 15, wherein the predetermined condition includes grouping one optional memory block included in a first plane of a first memory die among the memory dies, one optional memory block included in a second plane of the first memory die, one optional memory block included in a first plane of a second memory die and one optional memory block included in a second plane of the second memory die.

19. A memory system comprising:
    a memory device including a plurality of super memory blocks; and
    a controller suitable for generating a bad block pool and a reused super block table, and generating one or more reused super memory blocks based on the bad block pool and the reused super block table,
    wherein the bad block pool includes one or more bad super memory block indexes, one or more super memory block addresses and one or more bad memory block information respectively corresponding to one or more bad super memory blocks among the super memory blocks,
    wherein each bad memory block information includes a bitmap, each bit of which represents one of a normal memory block and a bad memory block included in a corresponding bad super memory block, wherein the reused super block table includes information of the reused super memory blocks, wherein each information of the reused super memory blocks includes a bitmap, each bit of which has one of values of the bad super memory block indexes and represents a normal memory block of one of the bad super memory blocks represented by the value of the bad super memory block index, wherein the controller generates the reused super memory blocks by replacing a bad memory block of a target super memory block with a normal memory block of a victim super memory block, and wherein the target memory block and the victim memory block are included in the bad super memory blocks.

20. The memory system according to claim 17, wherein the controller erases the bad memory block information included in the bad block pool, after generating the reused super memory blocks.

\* \* \* \* \*